(12) United States Patent
Lin

(10) Patent No.: US 7,817,459 B2
(45) Date of Patent: Oct. 19, 2010

(54) DEPLETION-MODE MOSFET CIRCUIT AND APPLICATIONS

(75) Inventor: Wen T. Lin, Ambler, PA (US)

(73) Assignee: Keystone Semiconductor Inc., Spring House, PA (US)

( * ) Notice: Subject to any disclaimer, the term of this patent is extended or adjusted under 35 U.S.C. 154(b) by 228 days.

(21) Appl. No.: 12/019,391

(22) Filed: Jan. 24, 2008

(65) Prior Publication Data

US 2008/0175045 A1  Jul. 24, 2008

Related U.S. Application Data

(60) Provisional application No. 60/886,363, filed on Jan. 24, 2007, provisional application No. 60/889,614, filed on Feb. 13, 2007, provisional application No. 60/891,053, filed on Feb. 22, 2007, provisional application No. 60/894,337, filed on Mar. 12, 2007, provisional application No. 60/980,506, filed on Oct. 17, 2007.

(51) Int. Cl.
*G11C 11/00* (2006.01)

(52) U.S. Cl. ...................... 365/154; 365/156

(58) Field of Classification Search ........ 365/154, 365/156, 190
See application file for complete search history.

(56) References Cited

U.S. PATENT DOCUMENTS

| 5,852,572 A * | 12/1998 | Jung et al. ............ 365/154 |
| 6,363,005 B1 * | 3/2002 | Wang et al. ........... 365/154 |
| 2006/0083052 A1 * | 4/2006 | Kang et al. ............ 365/154 |

* cited by examiner

*Primary Examiner*—Vu A Le
(74) *Attorney, Agent, or Firm*—Fox Rothschild LLP; Richard C. Woodbrigde; Perry M. Fonseca

(57) ABSTRACT

Positive logic circuits, systems and methods using MOSFETs operated in a depletion-mode, including electrostatic discharge protection circuits (ESD), non-inverting latches and buffers, and one-to-three transistor static random access memory cells. These novel circuits supplement enhancement-mode MOSFET technology and are also intended to improve the reliability of the complementary metal-oxide-semiconductor (CMOS) integrated circuit (IC) products.

8 Claims, 33 Drawing Sheets

US 7,817,459 B2

DEPLETION-MODE MOSFET CIRCUIT AND APPLICATIONS

CROSS REFERENCE TO RELATED APPLICATIONS

This application is related to, and claims priority from, U.S. Provisional Patent application No. U.S. 60/886,363 filed on Jan. 24, 2007 by W. Lin entitled "Electrostatic Discharge Protection and Prevention for Integrated Circuits", U.S. Provisional Patent application No. U.S. 60/889,614 filed on Feb. 13, 2007 by W. Lin entitled "Logic Circuits using Depletion Type MOSFET Transistors", U.S. Provisional Patent application No. U.S. 60/891,053 filed on Feb. 22, 2007 by W. Lin entitled "Logic Circuits using Depletion Type MOSFET Transistors", U.S. Provisional Patent application No. U.S. 60/894,337 filed on Mar. 12, 2007 by W. Lin entitled "Logic Circuits using Depletion Type MOSFET Transistors" and U.S. Provisional Patent application No. U.S. 60/980,506 filed on Oct. 17, 2007 by W. Lin entitled "Depletion MOSFET and its applications", the contents of all of which are hereby incorporated by reference in their entirety.

FIELD OF THE INVENTION

The present invention relates to the field of metal oxide semiconductor field effect transistors (MOSFET), and more particularly, to the simulation and use of depletion mode MOSFETs for electronic circuits, including electrostatic discharge protection circuits, Boolean logic circuits, buffering circuits and memory circuits.

BACKGROUND OF THE INVENTION

Metal Oxide Semiconductor Field Effect Transistor (MOSFET) technology is well-known, having been invented during the 1950s. Since 1970, it has become a standard technology for producing integrated circuits (ICs) in the semiconductor industry because of its ease of use, low current consumption and low production costs.

In its simplest implementation, a MOSFET is a three-terminal switch, typically fabricated on silicon substrate, having an insulated control gate terminal over a drain-to-source conduction channel. The current flowing in the conduction channel is typically controlled by a applying a voltage to the gate terminal. Being simple switches, MOSFET's are well suited to logic operation. They are also a good choice for low power applications as they consume very little current in operation, primarily because the control gate is insulated from the conduction channel.

MOSFET's can be fabricated to operate in two fundamentally different ways, commonly called enhancement-mode and depletion-mode, operation. In enhancement-mode operation, the MOSFET is in an "off" state unless a voltage is applied to the gate terminal to switch the transistor to an "on" state. In contrast, in depletion-mode operation, the MOSFET is in an "on" state and requires a voltage applied to the gate terminal to switch the transistor to an "off" state.

MOSFETs operating in enhancement-mode are often termed enhancement type MOSFETs and may be either N-channel or P-channel. Similarly, MOSFETs operating in depletion-mode are often termed depletion type MOSFETs and may be either N-channel or P-channel.

Because of there opposite default, or initial state, the logic operation of enhancement type MOSFETs is the opposite of the logic operation of depletion type MOSFET. Other than the difference of polarity, however, both types of MOSFET are theoretically identical in performing all logic operations.

The transfer characteristics of MOSFETs are shown in FIG. 1, with the voltage between the gate terminal and the source terminal (Vgs) plotted against the current flowing from drain to source (Ids).

The enhancement type MOSFET is simple to use, since the channel between drain and source becomes conductive only after the gate to source junction is energized, as shown in curves 142 and 144. The N type enhancement MOSFET is initially off, with no current Ids flowing when Vgs is zero, and becomes more conductive as $V_{GS}$ is made more positive, allowing a greater current Ids to flow from drain to source, as seen in curve 142. Similarly, the P type enhancement MOSFET is initially off, with no current flowing when Vgs is zero, and becomes more conductive, allowing a greater current to flow from drain to source as $V_{GS}$ become more negative, as seen in curve 144.

In contrast, a depletion type MOSFET can be thought of as having two modes of operation, as shown in curves 114 and 116. For instance, the N-type depletion MOSFET 114 has a depletion-mode in which the bias voltage at the gate, Vgs, is either zero or negative. In this mode, the N-type depletion MOSFET is "on", allowing a current to flow from drain to source, when the voltage is zero. As the bias voltage at the gate, Vgs, is made more negative, the current decreases and eventually stops, so that the MOSFET is "off".

The other mode of operation of the N-type depletion MOSFET is the enhancement mode, when the bias voltage at the gate, Vgs, varies from zero to more positive. At zero voltage, a current flows that may be considered as a large leakage current. As the bias voltage at the gate, Vgs, is increased the drain to source current increases, or is enhanced, just as in an N-type enhancement MOSFET.

The depletion type MOSFET operation, shown in curves 114 and 116, may also be thought of as a shifted version of enhancement type MOSFETs. For instance, N type depletion MOSFET curve 114 is similar to the N type enhancement MOSFET of curve 142, with a shift in the bias voltage at the gate, Vgs. This simplistic view allows the same model to be used to simulate both the enhancement type MOSFET and depletion type MOSFET, with appropriate change of the potential of the transistor.

This simplistic way of treating a depletion type MOSFET as a gate-bias shifted enhancement type MOSFET has a disadvantage. The simple treatment obscures the fact that the two types of MOSFET may be used to implement opposite logic, i.e., enhancement MOSFETs are "off" by default and may be turned "on" by an appropriate input, while depletion MOSFETs may be operated as "on" by default switch that may be turned off by an appropriate input.

Unfortunately, this simplistic treatment of depletion MOSFETs appears to have been built into the Simulation Program with IC Emphasis (SPICE). SPICE is an important software tool, originally developed by Nagel and Pederson at the University of Berkeley and released into the public domain in 1972. Since then, SPICE has become widely used in the semiconductor industry for designing integrated circuits.

Attempts to model depletion-mode MOSFET logic circuits in SPICE apparently result in what appears to be a pin assignment error or bug. This bug is further obscured by the fact that SPICE, apparently, does a good job of simulating the enhancement-mode behavior of a depletion type MOSFET.

The net effect of the simplistic model used for depletion-type MOSFETs appears to have been the neglect of depletion-mode logic circuits in IC design at the expense of enhancement-mode logic. This is a major oversight, as enhancement-mode MOSFET logic can only be used for "negative-logic" circuits such as, for instance, Boolean NAND or NOR gates, rather than "positive-logic" circuits such as, for instance, AND or OR gates.

What is needed is a method to deal with the SPICE pin assignment bug so that the software can be used to accurately predict the depletion-mode, or "positive-logic", behavior of depletion type MOSFETs. Such a method will allow the simulation of many important and novel depletion-mode circuits, confirming them as novel, workable IC designs.

SUMMARY OF THE INVENTION

Briefly described, the invention provides integrated circuit (IC) designs using depletion-mode MOSFET circuits made possible by a pin assignment method of dealing with software simulation of depletion-mode operation of MOSFETS.

In a preferred embodiment, the IC design includes a static, random access memory device that includes a memory, buffer cell comprising at least one depletion MOSFET transistor.

In a further embodiment, a two-transistor static random access memory cell that includes an enhancement MOSFET transistor forming a two-transistor static random access memory cell.

In yet a further embodiment, the IC design is a one-transistor, one-resistor, non-inverting buffer that may, with the further addition of an N type enhancement MOSFET transistor may be used to form a two-transistor, 1 resistor, static random access memory.

In another embodiment, the IC design is a two transistor, non-inverting buffer that includes two opposite type, depletion type MOSFETs. The addition of an N type enhancement MOSFET transistor the formation of a three-transistor static random access memory cell.

In an alternative embodiment, the IC design is a four-transistor boolean logic circuit comprising at least two depletion MOSFET transistors that may be an AND Boolean logic circuit, an OR Boolean logic circuit or a mixed AND Boolean logic circuit.

In a further, alternative embodiment, the IC design is an electrostatic discharge protection circuit, that includes an N type depletion MOSFET transistor and a P type depletion MOSFET transistor.

These and other features of the invention will be more fully understood by references to the following drawings.

DETAILED DESCRIPTION

There is a fundamental difficulty with the computer simulation technology for MOSFET regarding the definition of the source and drain pins; due to the symmetric structure of MOSFET, these two pins are inter-changeable in practice and the definition for the name of source and drain is only nomenclature and immaterial. However, these two pins must be defined precisely in the computer simulation program before the calculations begin. Traditionally, there are two methods to define the pins of MOSFET by using either the DC voltage or majority current carrier. With the voltage method, the pin with lower DC voltage is usually treated as the source and the pin with higher DC voltage is treated as the drain. The other traditional method to identify the source and drain is to use the concept of majority current carrier that whichever pin supplies the majority current carrier is regarded as the source. These two methods, unfortunately, are both imperfect.

Figure 2:
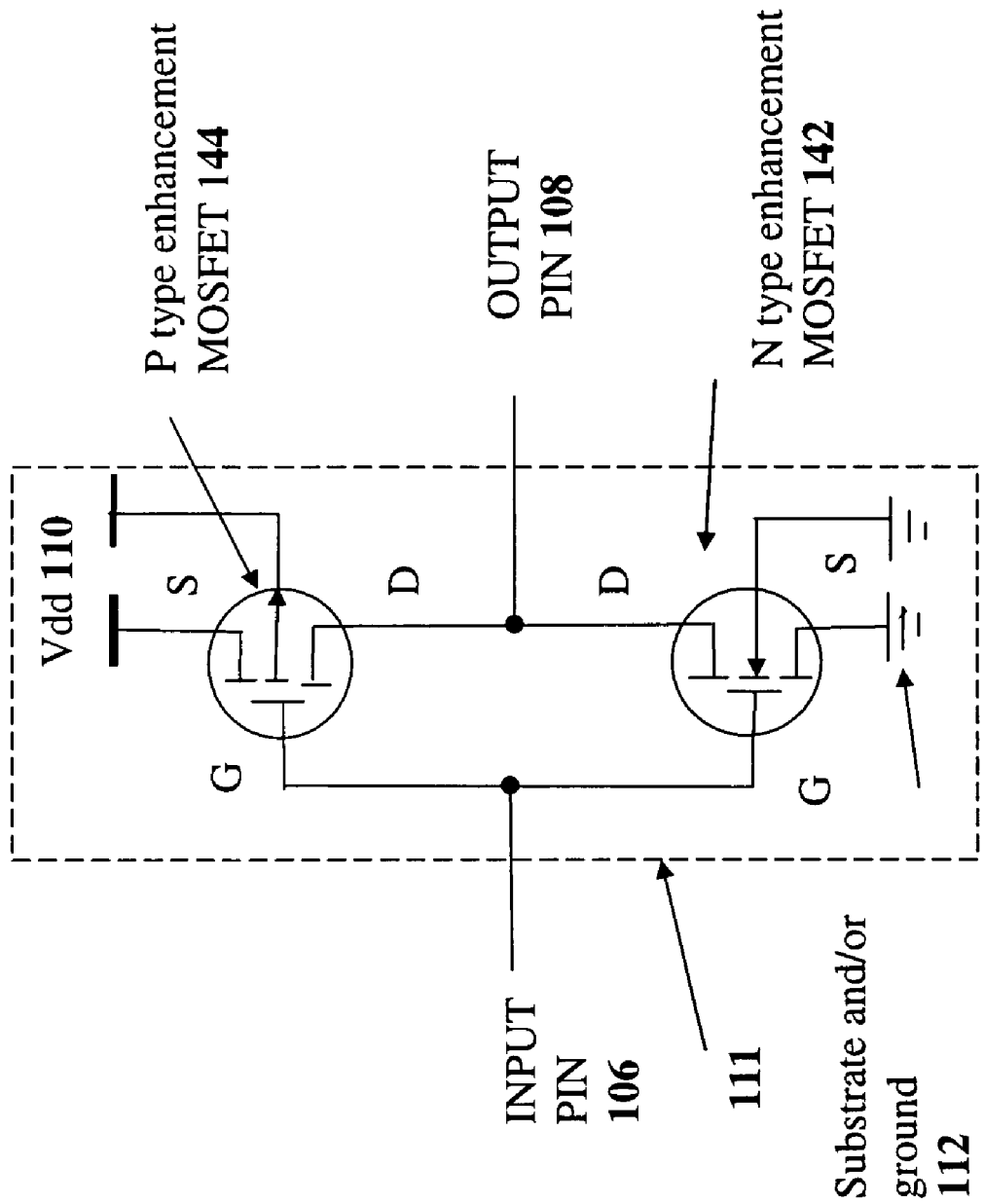
FIG. 2, the schematic diagram for an inverter (prior art).

Taking the traditional inverter 111 made of an N type enhancement MOSFET 142 and a P type enhancement MOS- FET 144 as shown in FIG. 2. If the concept of voltage to used identify the source and drain, then the source of the P type MOSFET 144 is connected to the drain of the N type MOSFET 142 and is the also output pin 108 of the inverter 111. This produces a problem when the input at the gate is at logic low since there is no way to guarantee that the output pin will be at logic high. To solve this problem, the method of pin assignment using DC voltage mentioned above can only be applied to N type device and the pins assignment must be reversed for P type device. For the P type device, the pin that has a higher DC voltage must be the source and the pin with lower DC voltage must be the drain.

With this slight modification, these voltage rules be used for enhancement type MOSFETs. This is how the SPICE program identifies the pins of the MOSFET before executing the simulation. Since, in SPICE, the depletion MOSFET is treated as a derivative of enhancement MOSFET, the same voltage rules are used for both the enhancement type MOSFET and depletion type MOSFET.

If, instead, the concept of majority current carrier is used to identify the source and drain, the source of the P type MOSFET in the inverter example of FIG. 2 will then be connected to the Vdd power supply pin and source of the N type MOSFET is connected to ground. The drains of both transistors are connected together as the output pin. The method of using majority current carrier to identify the source and drain pins is more accurate and can successfully explain the operation of enhancement MOSFET. Unfortunately, using the majority current carrier method prevents simulating depletion-mode MOSFET operation. This limitation is the result of the software preventing an N type depletion MOSFET being connected to a positive power supply voltage terminal, Vdd, or the P type depletion MOSFET being connected to the ground terminal, even though these connections are made in practical operation of depletion type MOSFETs.

There is no practical reason not to connect an N type depletion MOSFET 114 to the Vdd pin 110 and to connect a P type depletion MOSFET 116 to the ground pin 112. The depletion type MOSFET operated in the depletion mode is simply a switch that is normally ON until the junction between the gate and source is energized. The depletion type MOSFET really does not care what voltage the drain and source pins are connected to. The only thing that matters to a depletion type MOSFET operated in the depletion mode is whether if there is a voltage across the junction between the gate and source to energize the transistor and to pinch off the channel between drain and source. To pinch off the channel between source and drain, the gate of an N type depletion MOSFET 114 needs a negative voltage with respect to the source to induce positive charges in the channel between drain and source. When the N type depletion MOSFET 114 is connected to Vdd 110 which is the highest possible voltage of the system, the Vdd pin 110 will produce the highest negative potential difference to the voltage at the gate to pinch off the channel between the drain and source. The pin that is connected to Vdd 110 should, for the purpose of simulation, be regarded as the source pin for the N type depletion MOSFET 114 since this is where pinch-off first occurs.

Similarly, for a P type depletion mode MOSFET 116 that is connected to ground 112, a positive voltage is needed at the gate with respect to the source to induce negative charges in the channel between the drain and source to pinch off the channel. Since the ground 112 is the lowest possible voltage of the system, it will produce the highest potential difference for the voltage at the gate to pinch off the channel of P type depletion MOSFET 116. As a result, the ground pin 112 should become the source of the P-type depletion MOSFET 116 since it is where the pinch-off occurs first.

Whichever pin of the depletion MOSFET produces the most pinch-off should thus be considered to be the source pin for simulation of the depletion MOSFET because pinch-off determines the output state of depletion MOSFET. Likewise, for an enhancement MOSFET, since the induced majority current carrier in the drain to source channel determines the output state of enhancement MOSFET, whichever pin that produces the most induced majority current carrier should be the source of the enhancement MOSFET.

In conclusion, the source pin of a MOSFET should simply be the pin that produces either the most of the majority current carrier or the pinch-off. This definition of the source pin produces accurate and correct results for the all types of MOSFETs under all operating conditions and should be the only rule for the computer simulation to identify the source and drain pins.

Unfortunately, the current SPICE program lacks the concept of positive logic and uses the same voltage method to assign the source and drain pins for both the enhancement and depletion type MOSFET and the pin assignments for the depletion type MOSFET operated in the depletion mode are thus incorrect. The pin assignment problem can be demonstrated by the following example.

Figure 3:
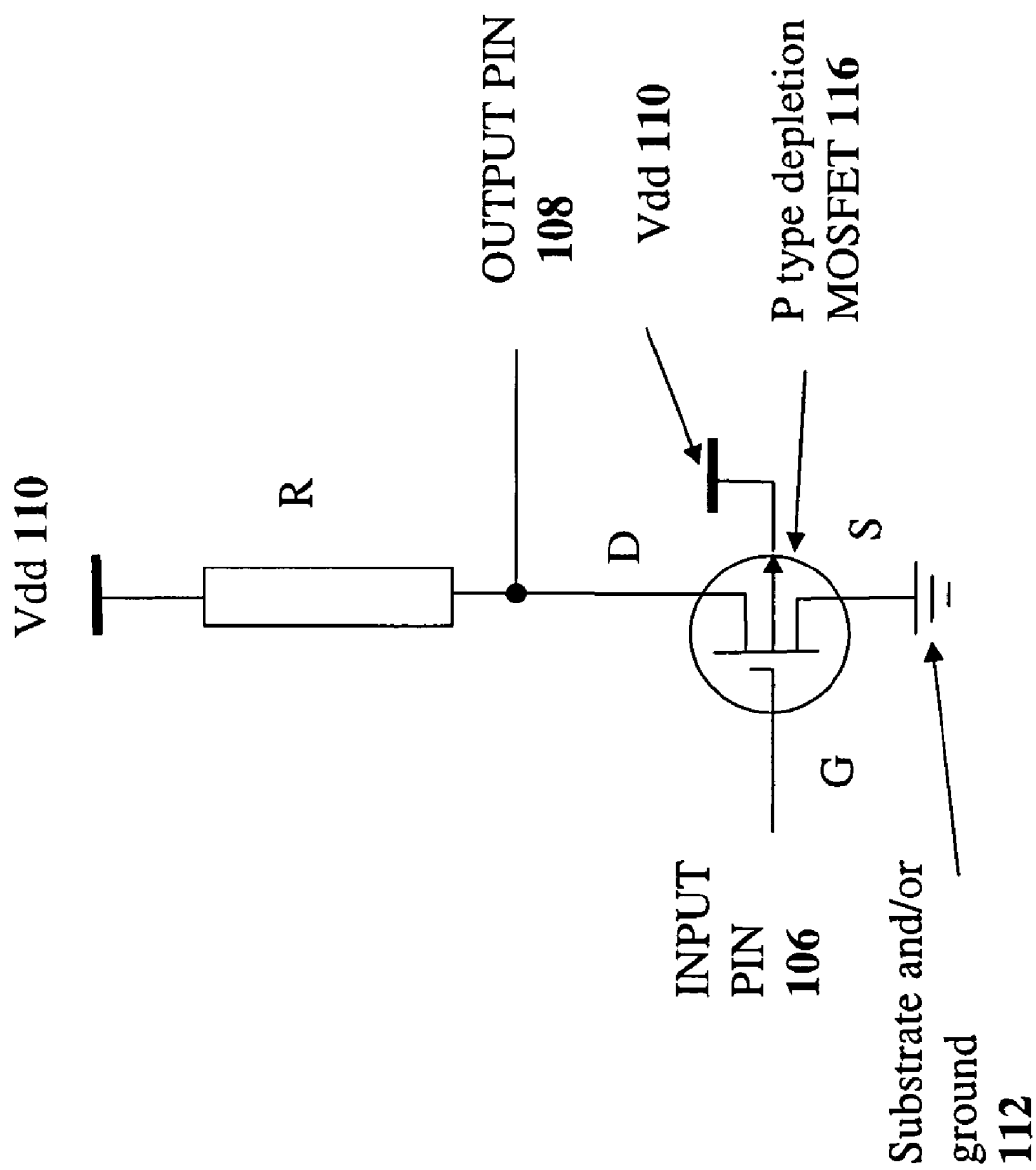
FIG. 3, the schematic diagram for a non-inverting buffer using depletion MOSFET.

The following example shows how the SPICE program failed to pinch-off a simple buffer circuit using the Philips model 11020 MOSFET as shown in FIG. 3. This Philips model uses potential to describe the MOSFET so that the only difference between enhancement and depletion device is the potential at the gate.

Figure 1:
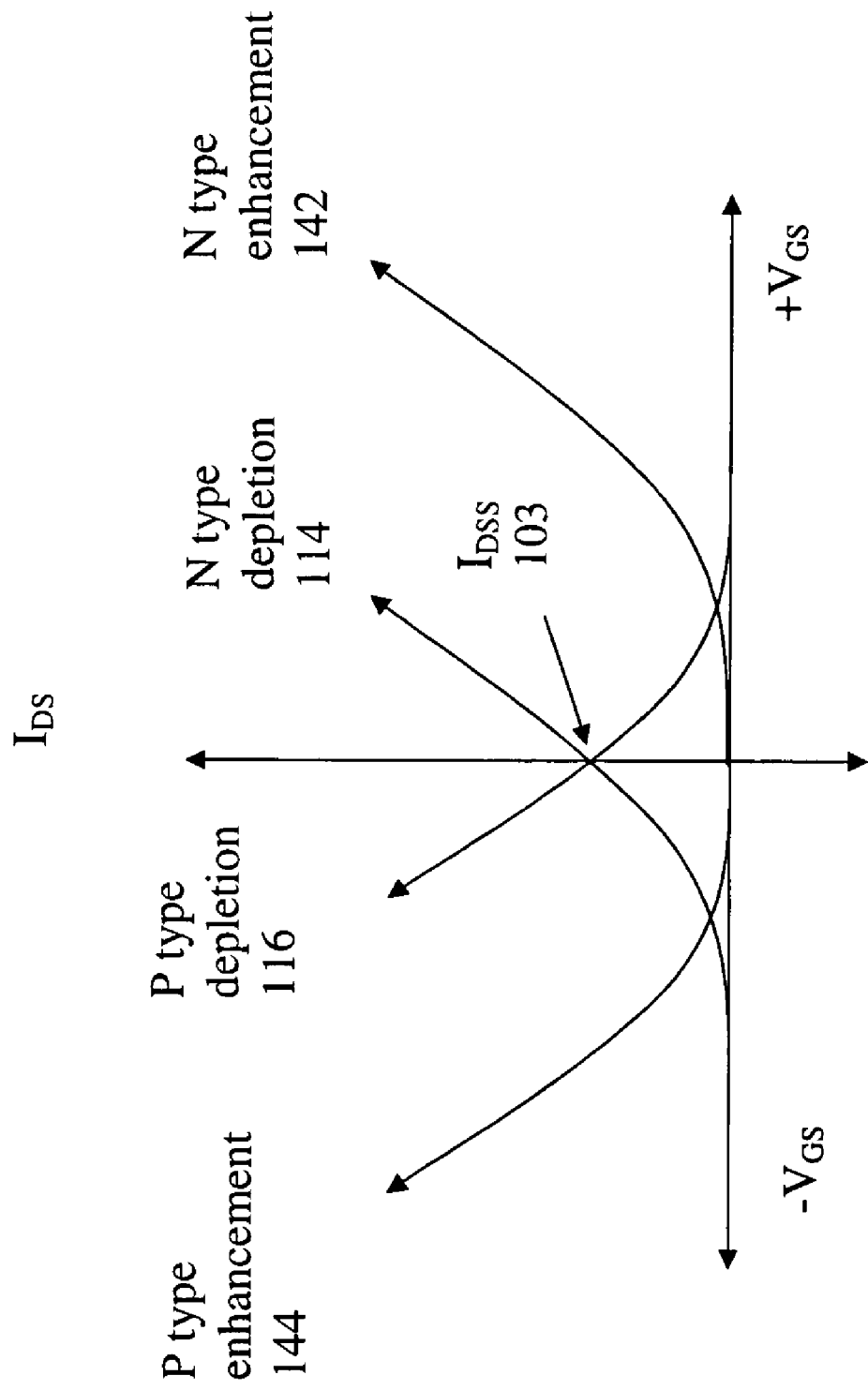
FIG. 1, the transfer characteristics of MOSFETs.

The boundary of the depletion mode operation for a depletion device is for VGS to be within 0 to Vdd for the P type depletion MOSFET 116 as shown in the FIG. 1.

Since the SPICE program always assigns the source pin to the higher DC voltage node for a P type transistor, the ground pin 112 is the drain pin to the SPICE program and the source pin is also the output pin 108. When the voltage of the gate input 106 is at the ground potential; since the voltage at the source 108 will be always higher than ground potential, the VGS is always negative so that a current larger than the IDSS 103 will flow in the drain to source channel. However, when the voltage at the gate input 106 is at Vdd 110; since the voltage at the source 108 will never be higher than the voltage at the gate input 106, the VGS will become positive and the current flowing through the drain and source channel becomes smaller than IDSS 103. Nevertheless, the SPICE program will never allow the P type depletion MOSFET 116 to become pinch-off when the voltage at the gate input 106 is ranged between ground 112 and Vdd 110 because the voltage at the gate input 106 must be much higher than the voltage at the source in order to produce pinch-off; but the higher the VGS becomes, the less current will flow through the drain to source channel so that the voltage at the source 108 become higher to reduce the VGS. As a result, it is impossible for the SPICE program to completely pinch off the drain to source channel because once the channel is pinched off, the voltage at the source 108 will become Vdd 110 and a current of IDSS 103 will flow through the channel again. Consequently, the VGS will never become large enough to pinch off the channel between drain and source completely. The only way to produce pinch-off using the SPICE program is to raise the voltage at the gate input 106 to be much higher than Vdd 110 because the voltage at the source output 108 will never be higher than Vdd.

Figure 4:
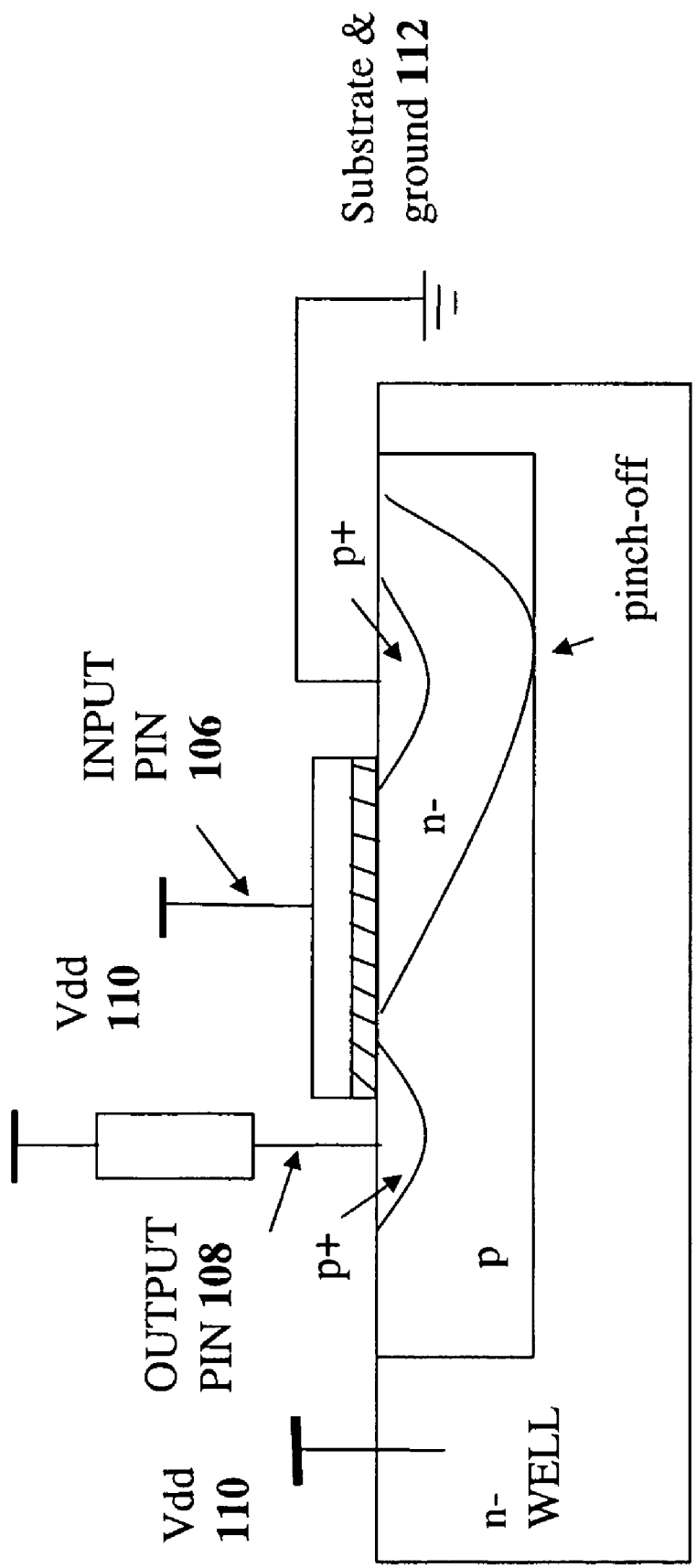
FIG. 4, the physical model for the non-inverting buffer as shown in FIG. 3.

However, considering the physical structure shown in FIG. 4 for the circuit as shown in FIG. 3. When the voltage at the gate input 106 is Vdd, a positive potential appeas across the junction between the gate 106 and the ground pin 112. This positive potential at the gate input 106 may induce a large quantity of negative charge in the P channel near the ground pin 112 and so produce pinch-off, despite the name of the pin. Since the voltage at the output pin 108 will be always higher than the voltage at the ground pin 112 in this example, the potential difference between the gate input 106 and the ground pin 112 will be always higher than the potential difference between the gate input 106 and the output pin 108. As a result, the pinch-off should always first occur at the junction between the gate input 106 and the ground pin 112. Unfortunately, this is not what the SPICE program predicts; the SPICE program predicts that the pinch-off will occur between the gate input 106 and the output pin 108 first instead; as a result, the only way to simulate pinch off in the SPICE program with a P type depletion MOSFET 116 is to raise the voltage at the gate input 106 to be much higher than Vdd 110. The figure in FIG. 4 illustrates the mistaken pin assignment of the SPICE program for depletion type MOSFETs.

If, however, the source pin is assigned according to pinch-off generation, the ground pin 112 should then be termed the source pin for the purposes of SPICE simulation for the P depletion type MOSFET 116. As a result, when the voltage at the gate input 106 is at ground potential, the gate to source junction will not be energized and VGS=0 and the drain to source channel will conduct so that the output voltage at the drain 108 is the ground voltage; but when the voltage at the gate input 106 is at Vdd 110, the gate to the source junction will be energized and VGS becomes positive so that the drain to source channel becomes pinched-off and the output voltage at the drain 108 is Vdd 110. The circuit as shown in FIG. 3 becomes a non-inverter buffer.

In a preferred embodiment, the non-inverting buffer of FIG. 3 includes a depletion MOSFET transistor that is a P type transistor. This depletion MOSFET transistor preferably has a gate terminal coupled to an input terminal, a substrate terminal coupled to a positive voltage supply terminal and a source terminal coupled to a ground terminal. The circuit includes a resistor having a first terminal coupled to the drain terminal of the P type depletion MOSFET transistor, and a second terminal coupled to said positive voltage supply terminal, thereby forming a one-transistor, one resistor non-inverting buffer.

Until the problem of pin assignment is fixed, the SPICE program will never allow engineers to produce pinch-off using depletion type MOSFET operated in depletion mode within normal voltage range although the pinch-off can be produced easily in practice for a depletion type MOSFET. Once the problem of pin assignment is identified and fixed, we can develop many new circuits that produce positive logic output based on the depletion type MOSFET and the development of MOSFET technology is finally complete. In addition to the positive logic, the depletion MOSFET can also produce the perfect protection circuit for the MOSFET from the damage of electrostatic discharge.

A preferred embodiment of the invention will now be described in detail by reference to the accompanying drawings in which, as far as possible, like elements are designated by like numbers.

Although every reasonable attempt is made in the accompanying drawings to represent the various elements of the embodiments in relative scale, it is not always possible to do so with the limitations of two-dimensional paper. Accordingly, in order to properly represent the relationships of various features among each other in the depicted embodiments and to properly demonstrate the invention in a reasonably simplified fashion, it is necessary at times to deviate from absolute scale in the attached drawings. However, one of ordinary skill in the art would fully appreciate and acknowledge any such scale deviations as not limiting the enablement of the disclosed embodiments.

ELECTROSTATIC DISCHARGE (ESD) PROTECTION

The electrostatic discharge (ESD) is a very damaging phenomenon affecting the reliability of ICs, especially for the CMOS IC products that inherently have high input impedance. The ESD event can occur during the testing, handling, shipping and packaging of the IC products when undesired static charged particles with a high potential difference to the IC produce a large voltage spike to generate enough heat to cause permanent damages to the IC. Since most of the ESD events occur inside the IC and are not noticeable until damage has already occurred, it is a very difficult problem to deal with. An ESD event typically ruptures the insulator under the gate of the input transistor of CMOS IC because the large voltage spike of the ESD event usually occurs at the gate of the input transistor. Since the insulator under the gate of a CMOS transistor is small and thin with very little capacitance, a high voltage spike can be generated with a small amount of static charge. Since the insulator is usually a poor thermal conductor that does not dissipate heat quickly, the gate structure of the CMOS IC is fragile and easily damaged. This problem is getting more severe as the physical size of CMOS IC is scaling down to improve the speed as well as the functionality of the IC. The protection of the CMOS IC devices from the damages due to ESD event is one of the most challenging tasks for the IC design engineers Potentially, the most useful solution for protecting CMOS ICs from ESD damage is one that does not allow the external static charged particles to produce a potential difference between the gate of the input transistor and the rest of the input transistor of CMOS IC, thereby avoiding damage the insulator under the gates of the input transistors. Instead, any ESD energy should be directed to the more robust ground and/or substrate and/or power supply lines.

Figure 5:
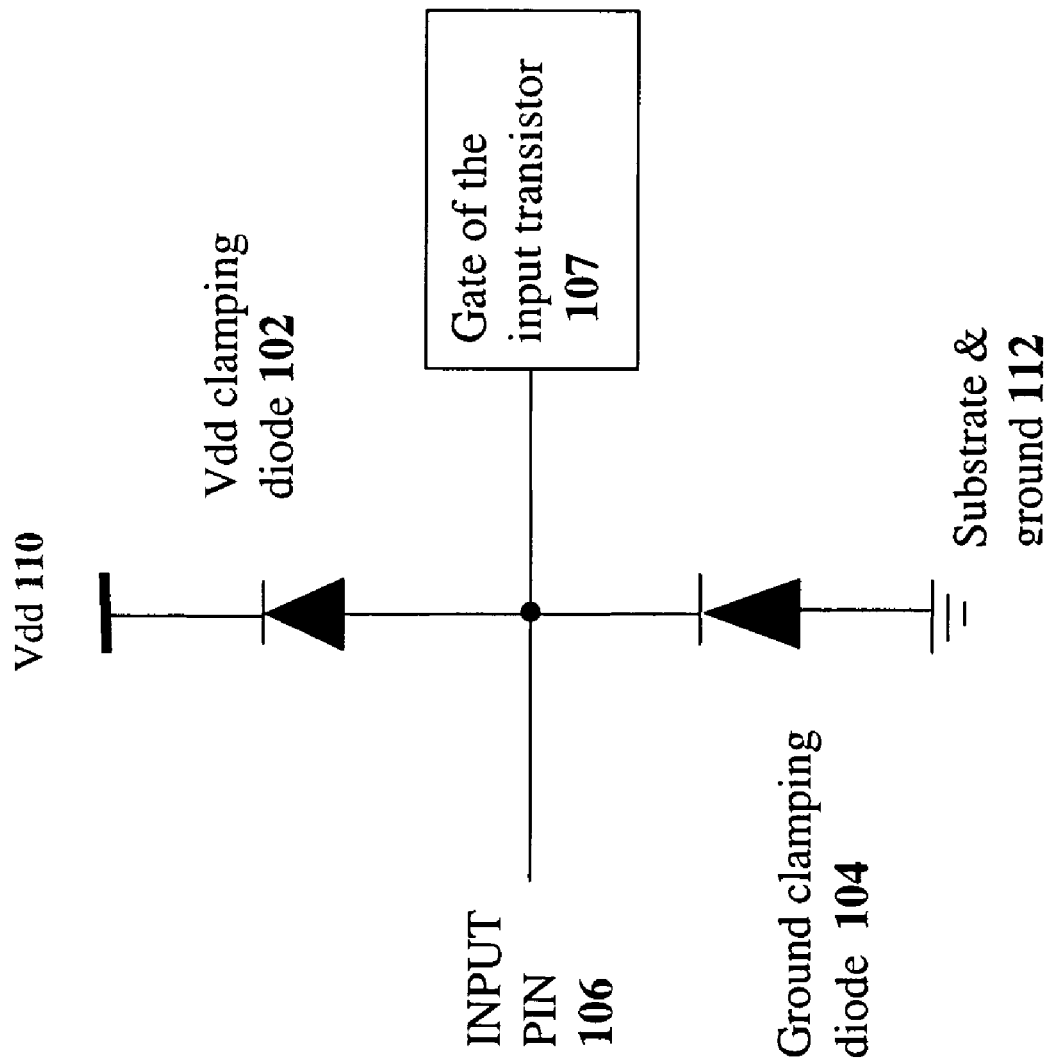
FIG. 5, the schematic diagram for the basic ESD protection using diodes (prior art).

To deal with the problem of voltage spike generated from the potential difference between operators at different places, the common solution is to install a voltage clamping circuit at every input lead of CMOS IC as shown in FIG. 5 to limit amplitude of the ESD voltage spike. Since the static charged oil and grease particles on the fingers of the operators are negative in charge, the negatively charged particles will produce a negative potential on the gate of the CMOS IC when the IC is touched. Assuming that the potential of the charged particles on the first operator in the factory is −V1 and the potential is a more negative −V2 on the second operator of an assembly line at the 30th floor of a skyscraper ten thousand miles away. Since the whole CMOS is floated, the potential at the gate, power supply, ground and substrate of the CMOS IC will all be −V1 after it is touched by the first operator. Since the static charged particles on the second operator have a higher negative potential, a negative voltage spike at the gate of the input transistor will quickly be formed when it is touched by the second operator. Before the input pin is touched by the second operator, although the input pin has already an electric potential of −V1, the voltage on every pin of the whole IC is zero since the IC is not powered up. After the input pin is touched by the second operator and a potential equalization current is generated, the voltage on the input pin 106 becomes more negative and the ground clamping diode 104 becomes conductive so that the voltage at the substrate and/or ground 112 will follow the ESD voltage at the input pin 106 after the ESD voltage is below −Vf where Vf is the forward voltage of the diode 104. Both the voltages at the input 106 and the ground and/or substrate 112 will continue to become more negative while the voltage at the power supply node Vdd 110 remains at the zero. The rising of the voltage at the input pin 106 and ground and/or substrate 112 into the negative direction will be stopped finally when the voltage at the input pin 106 causes the Vdd clamping diode 102 going into breakdown. The amplitude of ESD voltage spike occurring to the input pin 106 is thus limited to be within the difference of forward voltage and reverse breakdown voltage of the clamping diodes and an ESD voltage spike occurs between the gate 108 of the input transistor and the power supply line Vdd 110 of the CMOS IC when the potential of the static charged particles on the second operator is more negative. If the potential of the static charged particle of the second operator becomes positive for some reasons or less negative than the first operator, a positive voltage spike will be formed instead and the protective diodes can still clamp the ESD voltage spike within the same range between the difference of the forward voltage and reverse breakdown voltage of the clamping diodes but the positive ESD voltage spike will occur between the gate 108 of the input transistor and the ground and/or substrate 112 instead. As long as the insulator under the gate can survive this clamped voltage spike, the gate 108 of the input transistor will be protected either way.

There are two problems with the current solution. First, the voltage difference between the input pin 106 and the power supply line Vdd 110 of the CMOS IC is assumed to be equal to the breakdown voltage of the Vdd clamping diode 102 after the breakdown has occurred; but actually the voltage at the input pin 106 will rise much faster than the voltage at power supply line Vdd 110 because the power supply line Vdd 110 is connected to many transistors and probably also to a large bypass capacitor. Since the power supply line Vdd 110 inherently has a much larger capacitive loading than the gate 107 of the input transistor, the rise time of the voltage at the power supply line Vdd 110 is thus much longer than the rise time of voltage at the input pin 106 and a voltage spike with an amplitude exceeding the diode's breakdown voltage can be generated to produce excess heat to cause rupture on the insulator under the gate 107 of the input transistor. The other problem is that it is a constant uphill battle to clamp the voltage at the input pin 106 as the size of the gate is shrinking since a smaller gate will produce a larger, faster voltage spike and require an even faster clamping circuit.

The major problem with the current ESD protection technologies is that they all allow the static charged particles to produce a voltage spike between the gate of the input transistor and the rest of the input transistor of the CMOS IC since the resistance at the gate of the input transistor is very high. Even the movement of a single charged particle is capable of damaging the CMOS IC. The right way to avoid the damage due to the ESD event should then be to prevent the static charged particles from building up a potential difference between the gate 107 of the input transistor and the rest of the input transistor of the CMOS IC.

The two diodes 102 and 104 were originally designed to only provide an over-voltage protection to the input circuit of the CMOS IC. The purpose of Vdd clamping diode 102 is simply to prevent the voltage of logic high level input from exceeding the power supply voltage Vdd 110 plus the forward voltage of the diode and the purpose of ground clamping diode 104 is simply to prevent the voltage of logic low input level from falling more negative than the negative of the forward voltage of the diode. The current ESD protection technology using two diodes is actually an accidental byproduct of an over-voltage protection circuit.

An improved strategy for ESD protection may be to connect all the input pins 106 of the CMOS IC to the ground and/or substrate 112 and to the power supply line 110 with protective short-circuit connections to ensure that there is no potential difference between all the input pins and the circuits inside the CMOS IC when the CMOS IC is not powered up. As long as the input pins 106 always stay at the same potential as the ground and/or substrate 112 and the power supply line Vdd 110 of the CMOS IC, there will be no resistance to produce an ESD voltage between the gate 107 of the input transistor and the rest of input transistor of the CMOS IC to generate a voltage spike on the gate of the input transistor regardless of how many high potential charged particles are on the input pins 106 of the CMOS IC. So even when the second operator with a much higher potential touches the input pin 106 of the CMOS IC at a different place and a large voltage spike is generated, the voltage spike will release most of the energy to the robust metallic ground and/or substrate 112 and power supply line Vdd 110 of the CMOS IC, instead of totally to the fragile, poor thermal conductive insulator under the gate 108 of the input transistor. As long as the protective short-circuit connection between the input pin 106 and ground and/or substrate 112 and the power supply line Vdd 110 can survive the heat generated from the energy of ESD voltage spike, the CMOS IC is protected. Since the protective short-circuit connection between the input pin 106 and the substrate and/or ground 112 and power supply line Vdd 110 can be designed to pass as much current as we want, the CMOS IC can survive an ESD event easily. With a short-circuit protection circuit, the resistance between the gate 107 of the input pin of the CMOS IC and the rest of the CMOS IC is now too low to produce the damaging voltage spike on the gate structure while the resistance on the ground and/or substrate and power supply line is now very high since the whole CMOS IC is floated. An ESD voltage spike is thus produced on the ground and/or substrate and the power supply line instead of on the gate of the input pin 107.

Figure 6:
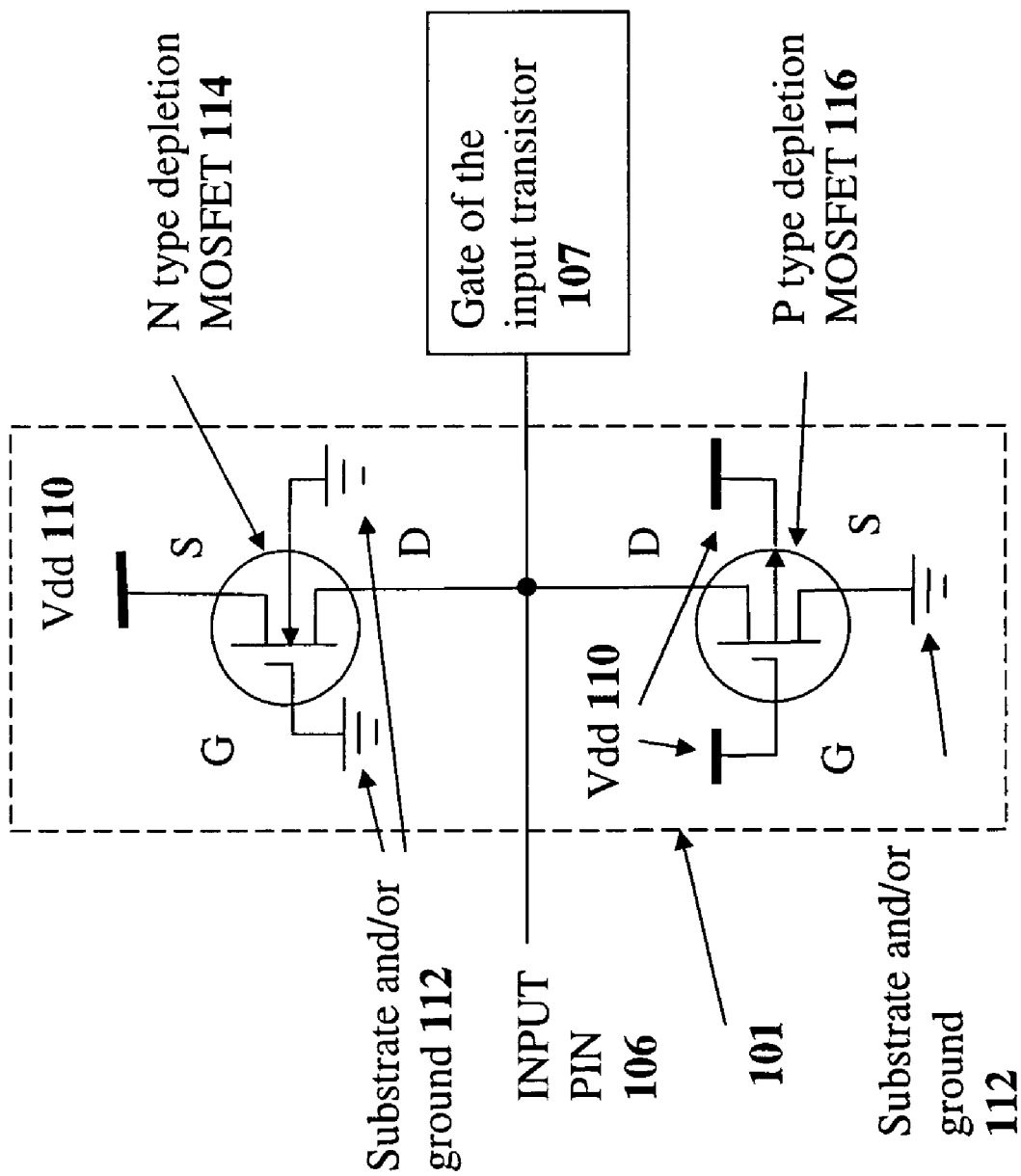
FIG. 6, the schematic diagram for the ESD protection using depletion MOSFET as the first preferred embodiment.

A novel ESD protection circuit 101 is illustrated in FIG. 6 as the first preferred embodiment of the present invention. This design uses depletion type MOSFETs to try to ensure that the input pins 106 of the CMOS IC always stay at the same potential as the ground and/or substrate 112 and power supply line Vdd 110 of the CMOS IC when the CMOS IC is not powered up. In this illustrated circuit, a P type depletion MOSFET 116 provides a short-circuit connection between the input pin 106 of the CMOS IC to the ground and/or substrate 112. The drain of the P type depletion MOSFET 116 is connected to the input pin 106 and the gate 107 of the input transistor of the CMOS IC to be protected while the source of the P type depletion MOSFET 116 is connected to the ground and/or substrate 112 of the CMOS IC. Since the channel between the drain and the source of P type deletion MOSFET 116 is an electric short-circuit when the gate of the P type depletion MOSFET 116 is not energized, the input pin 106 of the CMOS IC is always at the same potential as the ground and/or substrate 112 of the CMOS IC when the CMOS IC is not powered up. When the CMOS IC is powered up, since the gate of the P type depletion MOSFET 116 is connected to the power supply line Vdd 110, the junction between the gate and source of the P type depletion MOSFET 116 will be energized as soon as the CMOS IC is powered up. As a result, the channel between the drain and the source of the P type depletion MOSFET 116 will be pinched off immediately when the CMOS IC is powered up and only a very small pinch-off current is allowed to pass through the channel of the P type depletion MOSFET 116 after the CMOS IC powered up.

An N type depletion MOSFET 114 may also used to provide a short-circuit connection between the input pin 106 and the power supply line Vdd 110 of the CMOS IC when the CMOS IC is not powered up. The source of the N type depletion MOSFET 114 is connected to the power supply line Vdd 110 while the drain of the N type depletion MOSFET 114 is connected to the input pin 106 and the gate of the input transistor 107 of the CMOS IC to be protected. Since the gate of N type depletion MOSFET 114 is connected to the ground and/or substrate 112 and the source of the N type depletion MOSFET 114 is connected to the power supply Vdd line 110, the channel between the drain and the source of the N type depletion MOSFET 114 is a short-circuit connection when the source of the N type depletion MOSFET 114 is not powered up. As a result, the potential of the input pin 106 of the CMOS IC is equal to the potential at both the ground and/or substrate 112 and the power supply line Vdd 110 of the CMOS IC when the CMOS IC is not powered up so that there is no potential difference between the gate 107 of the input transistor and the rest of the input transistor of the CMOS IC when the CMOS IC is not powered up and the static charged particles will never produce a voltage spike on the gate 107 of the input transistor of the CMOS IC during an ESD event.

When the CMOS IC is powered up, the junction between the gate and source of the N type depletion MOSFET 114 is energized and the channel of N type depletion MOSFET 114 is pinched off almost immediately and only a small pinch-off current passes through the N type depletion MOSFET 114 when the CMOS IC is powered up. If the pinch off current of the N type depletion MOSFET 114 is approximately equal to the pinch off current of the P type depletion MOSFET 116, then the protective short-circuit connection 101 will become open and invisible to the CMOS IC when the CMOS IC is powered up.

Both the N type 114 and P type 116 depletion MOS may be fabricated with the rest of regular enhancement transistors in the CMOS IC. The depletion MOSFETs may be fabricated without the first poly layer which is normally used to define the length of the channel for the enhancement type transistor. Instead, the whole channel between the drain and the source of the depletion MOSFET may be preserved and a different poly layer added later for the gate of the depletion type MOSFET. Since the channel between the drain and the source of a depletion type MOSFET is built without the first poly layer, the channel between the drain and the source of a depletion type MOSFET is full of majority current carriers and is always a short-circuit connection electrically when the junction between the gate and source of the depletion type MOSFET is not energized. Since the whole purpose of the depletion type MOSFET is to produce a low impedance current path from the input pins 106 of the CMOS IC to the ground and/or substrate 112 and to the power supply line Vdd 110 of the CMOS IC, the only requirements for the depletion type OSFETs are to safely pass a lot of current and matched.

The same protective short-circuit connection 101 may also be used for every output pins of the CMOS IC as well. Since the output pins of the CMOS IC are always connected to either the drain or source of the MOSFETs and they are always much strongly built than the delicate gate structure of the MOSFET, the protective short-circuit connections circuit 101 for the output pins can be smaller physically.

Since the substrate of a CMOS IC should connect to the lowest potential of the whole IC which is usually the ground network, the ground and substrate are usually connected together electrically. It is quite straight-forward to implement the protective short-circuit connection network 101 with a CMOS IC when the ground and substrate of the CMOS IC are connected together. But since the substrate can be connected to a negative potential instead of ground in some applications, we will need to determine which pin for the protective short-circuit connection network 101 to connect to. Normally, the short-circuit protection circuit 101 should connect the input pin 106 and power supply line 110 to the substrate instead of the ground network because the substrate is always larger than the ground network physically to dissipate more heat. Nevertheless, since substrate is made of semiconductor material which does not dissipate heat as quickly as the ground network which is usually metallic, a smaller ground network might actually dissipate the heat more effectively than the larger substrate. In this case, the ground network becomes the better choice for the protective short-circuit connection network 101 to connect the input 106 and power supply line 110 to. The protective short-circuit connection network 101 should connect the input pin 106 and the power supply line 110 to whichever of the ground pin or substrate pin that can dissipate the heat generated from the ESD voltage spike more effectively or to both pins.

In summary, in a preferred embodiment of the electrostatic discharge protection circuit, it includes an N type depletion MOSFET transistor; a P type depletion MOSFET transistor; a ground terminal coupled to a source terminal of said P type depletion MOSFET transistor and to both a gate terminal and a substrate terminal of said N type depletion MOSFET transistor; a positive power terminal coupled to a source terminal of said N type depletion MOSFET transistor and to both a gate terminal and a substrate terminal of said P type depletion MOSFET transistor; an input terminal coupled to a drain terminal of both said N type depletion MOSFET transistor and said P type depletion MOSFET transistor; and an output terminal coupled to said input terminal, thereby providing electrostatic discharge protection circuit.

NON-INVERTING BUFFER

Figure 7:
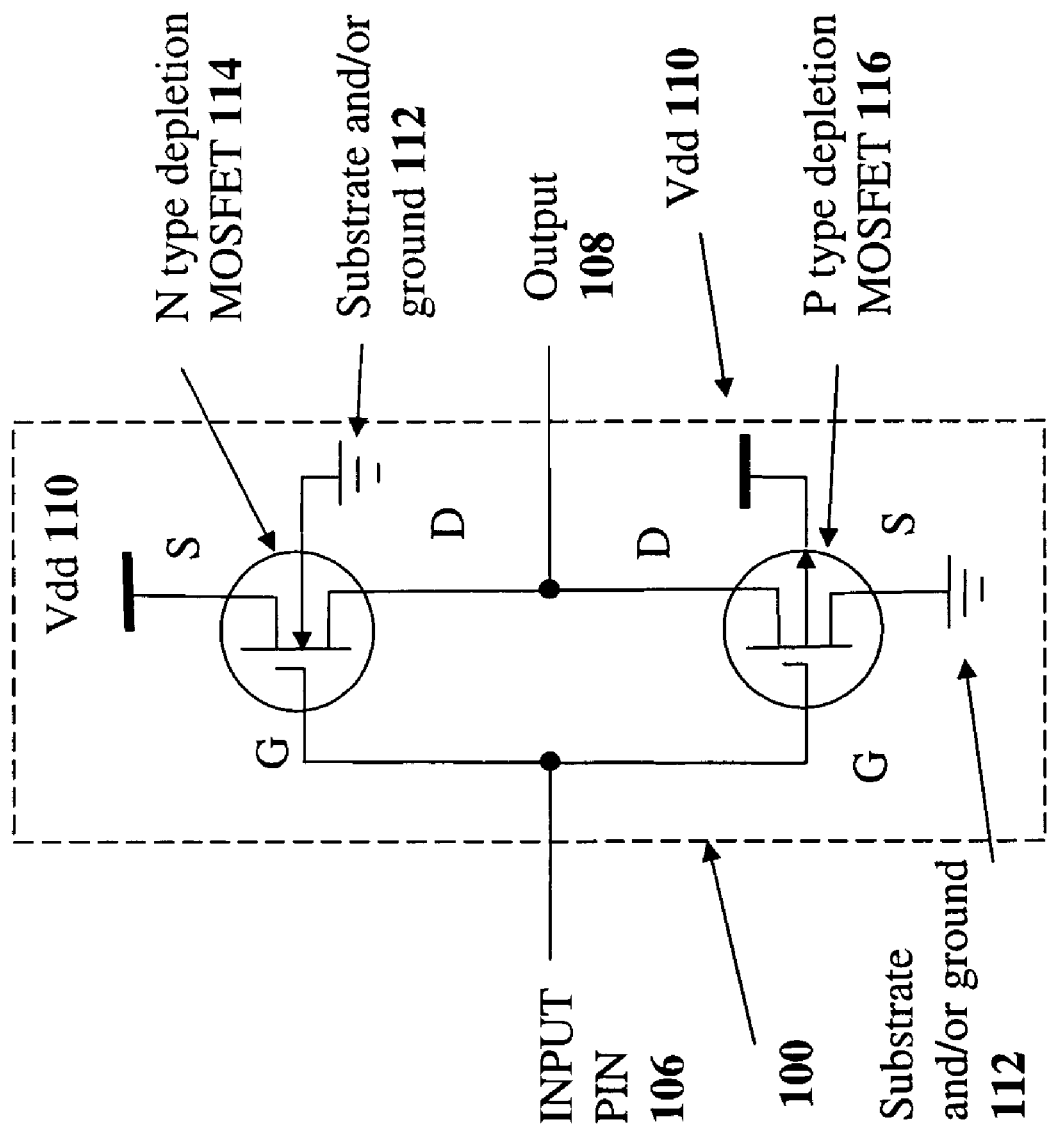
FIG. 7, the schematic diagram for a non-inverting buffer using depletion MOSFETs.

A relatively simple logic circuit that uses the depletion type MOSFET is a non-inverting buffer 100 as shown in FIG. 7. The non-inverting buffer 100 is made of an N depletion type MOSFET 114 and a P depletion type MOSFET 116. The gates of both MOSFETs are connected together as the input pin 106 and the drain of both MOSFETs are connected together as the output pin 108. Since the source of the P depletion type MOSFET 116 is connected to ground and/or substrate 112, the drain of the P depletion type MOSFET 116 will be shorted to ground and/or substrate 112 when the gate-to-source junction of the P depletion type MOSFET 116 is not energized and the input pin 106 is at low logic level of 0 volt. To the N depletion type MOSFET 114, since a low logic level at the input pin 106 will energize the gate-to-source junction, the channel between drain and source of the N depletion type MOSFET 114 will be pinched off and remain in the high impedance state. As a result, the output of the buffer 108 will remain at logic low when the input pin 106 is at logic low. When the input pin 106 is switched to a high logic level of Vdd 110, since the source of the N depletion type MOSFET 114 is also connected to the Vdd 110, the gate-to-source junction of the N depletion type MOSFET 114 is not energized so that the drain of the N depletion type MOSFET 114 will be shorted to the source at Vdd 110 and the output pin 108 will become logic high. To the P depletion type MOSFET 116, since the gate-to-source junction is now energized, the drain-to-source channel will become pinched off and remain in the high impedance state. As a result, the output of the buffer 108 will remain at the logic high and the state of the buffer output 108 will always follow the state of the buffer input 106.

In summary, the non-inverting buffer of FIG. 7 includes an N type depletion MOSFET transistor and a P type depletion MOSFET transistor. The N type depletion MOSFET transistor has a source terminal coupled to a positive voltage supply terminal, a substrate terminal coupled to a ground terminal, a gate terminal coupled to an input terminal, and a drain terminal coupled to an output terminal. The P type depletion MOSFET transistor has a source terminal couple to the ground terminal, a substrate terminal coupled to the positive voltage supply terminal, a gate terminal coupled to the input terminal and a drain terminal coupled to an output terminal, thereby forming a two transistor, non-inverting buffer.

The current consumption of the non-inverting buffer 100 built with depletion type MOSFETs can be very low since the current consumed by the non-inverting buffer 100 is equal to the pinch-off current of the devices which is contributed by the majority current carrier in the drain-to-source channel and can be controlled to be within a minimum level. The pinch-off current is very different to the leakage current flowing through the substrate. The leakage current is contributed by minority current carrier in both the substrate and drain region of the transistor. Although the amount of leakage current is usually small, it is very difficult to control the amount of leakage current precisely and the amount of leakage current can vary over a large range among devices. Another problem of the leakage current is that it has a long thermal time constant since the leakage current is generated by the thermal nature of the devices. In contrast, the pinch-off current can be controlled precisely to be as low as the leakage current.

NON-INVERTING LATCH

Figure 8:
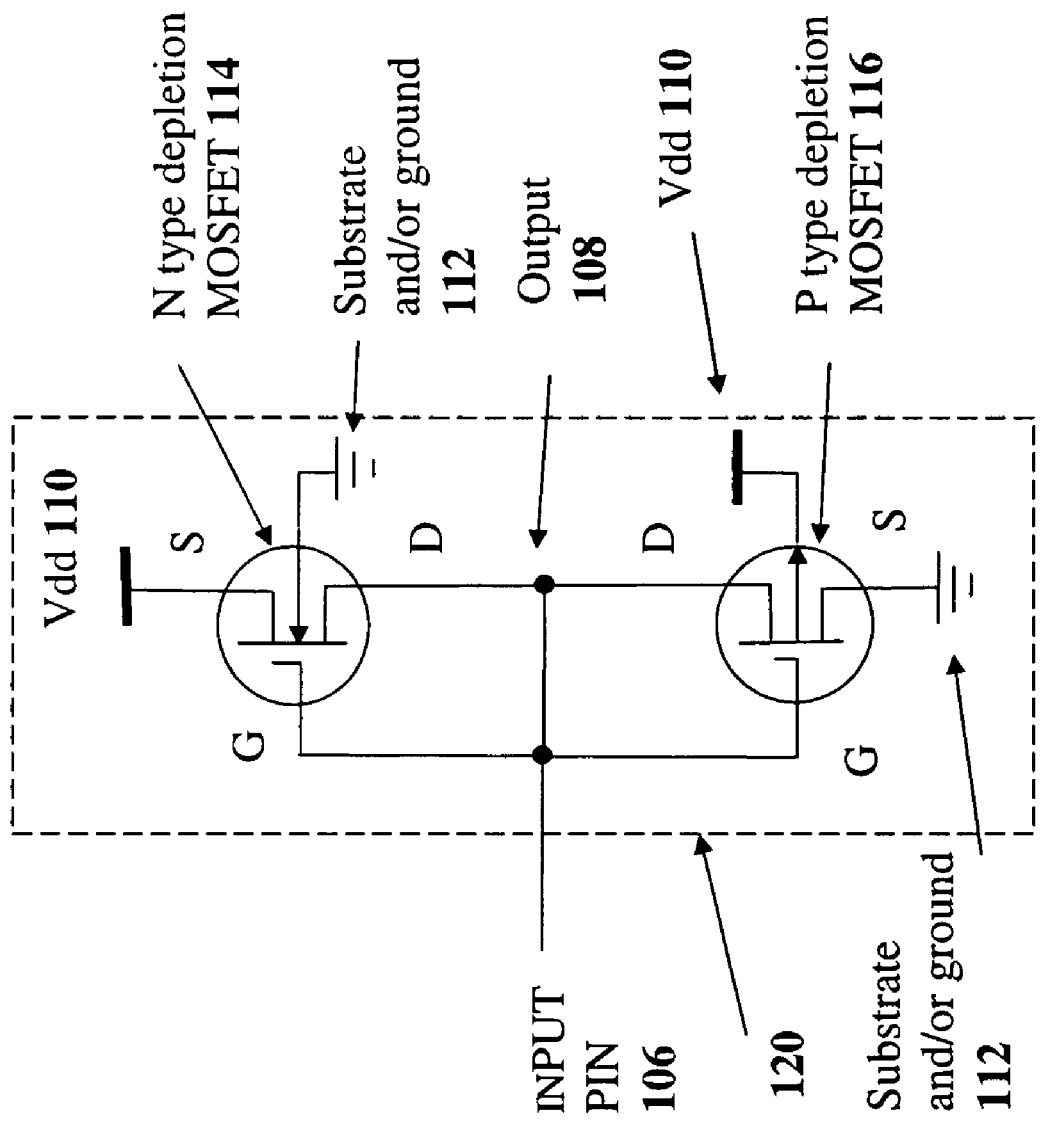
FIG. 8, the schematic diagram for a latch using depletion MOSFETs.

The non-inverting buffer 100 can be made into a non-inverting latch circuit 120 easily as shown in FIG. 8 by shorting the input pin 106 and output pin 108 together. The non-inverting latch 120 thus becomes a memory cell. Since the state of the output pin 108 and the state of the input pin 106 are always in the same phase, shorting the input pin 106 together with the output pin 108 will provide a positive feedback for the non-inverting latch 120 to lock the state of the output pin 108. As a result, the state of the output pin 108 of the non-inverting latch 120 will remain at the current state forever; the high logic output state will be retained by the N type depletion MOSFET 114 and the low logic output state will be retained by the P type depletion MOSFET 116 as long as the power supply is active even if the input signal 106 is removed afterward.

3T-SRAM CELL

Figure 9:
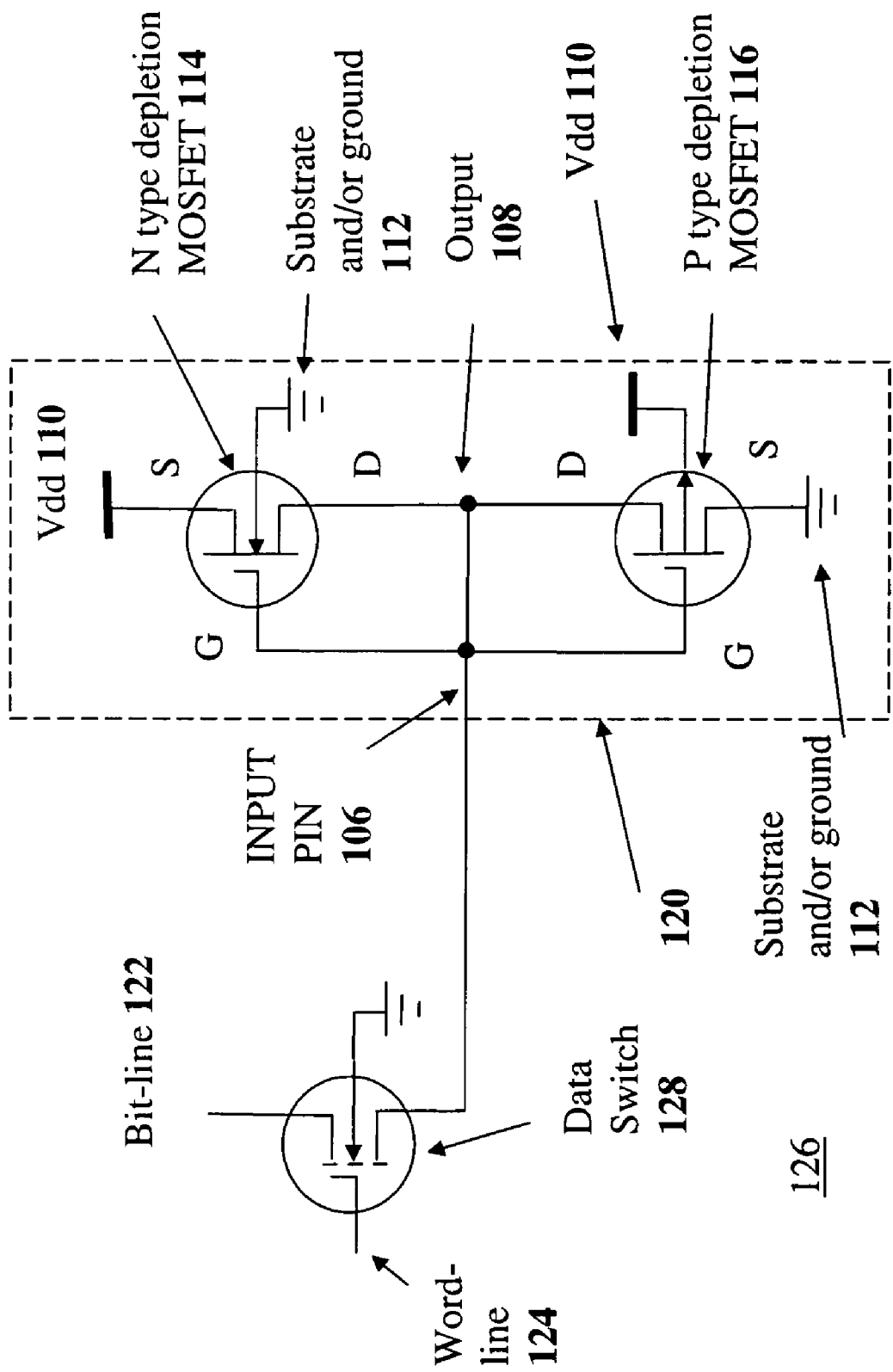
FIG. 9, the schematic diagram for a 3T-SRAM cell as the second preferred embodiment.

The non-inverting latch 120 can thus be used as a memory cell for 3T-SRAM 126 (3-transistor Static Random Access Memory) as shown in FIG. 9 as the second preferred embodiment. In this design, a data switch transistor 128 controlled by the word-line 124 can read or write the data on the bit-line 122 from or into the memory cell 120. The data switch transistor 128 can be built with a regular enhancement type MOSFET as shown in the FIG. 9 or any other switching device. The word-line 124 signal is the enable signal to control the data switch transistor 128 and the signal on the bit-line 122 is the I/O data. A 3T-SRAM cell 126 can thus be built with only two depletion type MOSFETs as the memory cell 120 and a data switching transistor 128 and the data in the 3T-SRAM cell 126 can be accessed with only a single data I/O bit-line 122 and a single enabling word-line 124. The new 3T-SRAM cell 126 is far superior to the traditional 6T-SRAM since it uses only half of the hardware. The new 3T-SRAM cell 126 is actually more similar to the DRAM cell which is made of a transistor and a capacitor.

In a preferred embodiment, the 3T-SRAM includes an N type depletion MOSFET transistor and a P type depletion MOSFET transistor. The N type depletion MOSFET transistor has a source terminal coupled to a positive voltage supply terminal and a substrate terminal coupled to a ground terminal. The P type depletion MOSFET transistor has a source terminal couple to the ground terminal and a substrate terminal coupled to the positive voltage supply terminal. In addition, the gate terminal of the N type depletion MOSFET transistor is coupled to the drain terminal of the N type depletion MOSFET transistor, to the gate terminal of said P type depletion MOSFET transistor and to the drain terminal of the P type depletion MOSFET transistor. In addition, there is an N type enhancement MOSFET transistor having a drain terminal coupled to the gate terminal of the N type depletion MOSFET transistor, a substrate terminal coupled to the ground terminal, a source terminal coupled to a data line and a gate terminal coupled to an address line, thereby forming a three-transistor static random access memory.

Both the SRAM and DRAM belongs to the volatile memory cells because they can not retain the memory if the power supply is removed. A non-volatile memory cell can retain the data for a very long period of time without power supply. Since the non-volatile memory cells are built by completely different technologies to the volatile memory cells, they will not be discussed further in this patent disclosure.

Traditionally, there are two kinds of volatile memory cell, the SRAM and DRAM. A traditional SRAM memory cell uses four enhancement type MOSFET transistors to latch the data and needs two more MOSFET transistors as the data I/O switch. It requires four enhancement type MOSFET to latch a data bit because it is impossible to build a non-inverting latch with only two enhancement type MOSFET transistors due to the nature of negative logic. In order to produce a positive feedback to latch the data, two inverters that each is made of two enhancement type MOSFET transistors are needed to produce a positive feedback and a total of four enhancement type MOSFET transistors is thus needed to latch a data bit. Since two of the four enhancement type MOSFETs in the latch are constantly on and the other two are constantly off, the current consumption of the 6T-SRAM cell is high. Despite of the disadvantages of size and current consumption, since the data of 6T-SRAM cell can be accessed quickly and the data will be kept indefinitely without any maintenance as long as the power supply is active, 6T-SRAM cell is very easy to use and is still popular in the applications such as desktop computers or games that require moving lots of data quickly. However, as the CMOS IC is scaled down in size, it becomes harder to produce 6T-SRAM. The problem of 6T-SRAM is due to the fact that two inverters are needed to produce a positive feedback to latch the data. If the two inverters are not matched perfectly, one of the inverters will slew faster than the other when the data content is changed. The difference of the rate of slewing between the inverters will reduce the noise margin since a smaller noise can cause the 6T-SRAM to trap in the illegal state and become unstable. Since the leakage current becomes larger while the operating current of the inverter becomes smaller as the CMOS IC is scaled down, the noise margin of 6T-SRAM deteriorates quickly when the CMOS IC is scaled down. To overcome this difficulty, the size of the 6T-SRAM must remain fairly large and can not be shrunk as much as the rest of the CMOS IC in the scaling down process.

The new 3T-SRAM cell 126 is an improvement on the traditional 6T-SRAM due to the simplicity of positive logic to produce positive feedback to latch the data input. The 3T-SRAM cell 126 consumes less current and occupies less room and may be shrunk easily because it is inherently stable. The noise margin of the 3T-SRAM is the same as all other circuits so that as long as the operating current of the 3T-SRAM is much larger than the leakage current, the data content of the memory cell is stable. The 3T-SRAM is actually more similar to the memory cell of DRAM than to the traditional 6T-SRAM.

The DRAM memory cell is very small and consumes very little current. The DRAM memory cell is normally made of a MOSFET transistor as the data switch and a capacitor to store the data. It is the simplest structure of memory cell of any kind until now and occupies the least room and consumes the least amount of current. However, since there is a constant leakage current through the substrate of the IC, the capacitor will lose the stored high logic level data over time. As a result, a DRAM memory cell needs to be refreshed to maintain the data constantly. The requirement of refreshing complicates the operation of DRAM and lengthens the access time for the DRAM cell. Despite these difficulties, since the DRAM cells can be packed densely, they are very popular for applications such as camera that needs to store a large number of pixels. The other advantage of the DRAM cell is that it consumes very little current. The only current consumed by the DRAM cell is through the leakage current of the capacitor. The power saving feature of DRAM cell makes it very popular among the portable applications such as cell phone.

Since the DRAM offers much more advantages over SRAM, the DRAM has dominated the memory products, especially in the portable applications. In order to ease the use of DRAM, numerous technologies were invented during the past twenty years to ease the refreshing of DRAM cells and to make the DRAM to behave like the SRAM; for example, to hide the refreshing from the application either by using additional hardware or software. Nevertheless, these clever technologies—commonly known as 1T-SRAM® or pseudo-SRAM technologies, are difficult to use and usually impose limit on memory access time since the refreshing mechanism and the data read/write operation can not occur at the same time no matter how smart these technologies are.

Since the new 3T-SRAM cell 126 is a static RAM cell, it does not require maintenance so that it is very easy to use just like a regular 6T-SRAM cell. Since the 3T-SRAM cell 126 can use two depletion type MOSFETs to replace a capacitor and the size of the two depletion type MOSFETs can be very small because the drain-to-source channel must be very narrow to be easily pinched off completely. Since the two depletion type MOSFETs of the 3T-SRAM cell 126 can be manufactured along with all other regular enhancement type MOSFET without requiring any special process, the 3T-SRAM 126 can be built much easier than DRAM which is notorious for its complicated process to produce capacitors. Since the level of the output signal from the 3T-SRAM 126 memory cell is always equal to the voltage of the power supply rails, the 3T-SRAM memory cell 126 produces an output signal with a large voltage swing. As a result, we can use only a single I/O bit-line 122 and a single enabling word-line 124 to read the data from the 3T-SRAM memory cell 126 with a good confidence and a 3T-SRAM memory cell 126 does not require complementary differential bit-lines to improve the signal-to-noise ratio. The ability to use a single data I/O bit-line 122 and a single word-line 124 to access the data in the memory cell doubles the density of the 3T-SRAM memory cell 126 when it is compared with the traditional SRAM and DRAM cells.

The 3T-SRAM cell 126 consumes as little power as the DRAM, can be packed almost as densely as the DRAM, can access the stored data quickly without timing restrain, can produce a large output signal and can be manufactured at almost half of the labor of DRAM; it has all the benefits of both SRAM and DRAM but without their difficulties. It is simply the most desirable volatile memory cell.

AND LOGIC GATE

Figure 10:
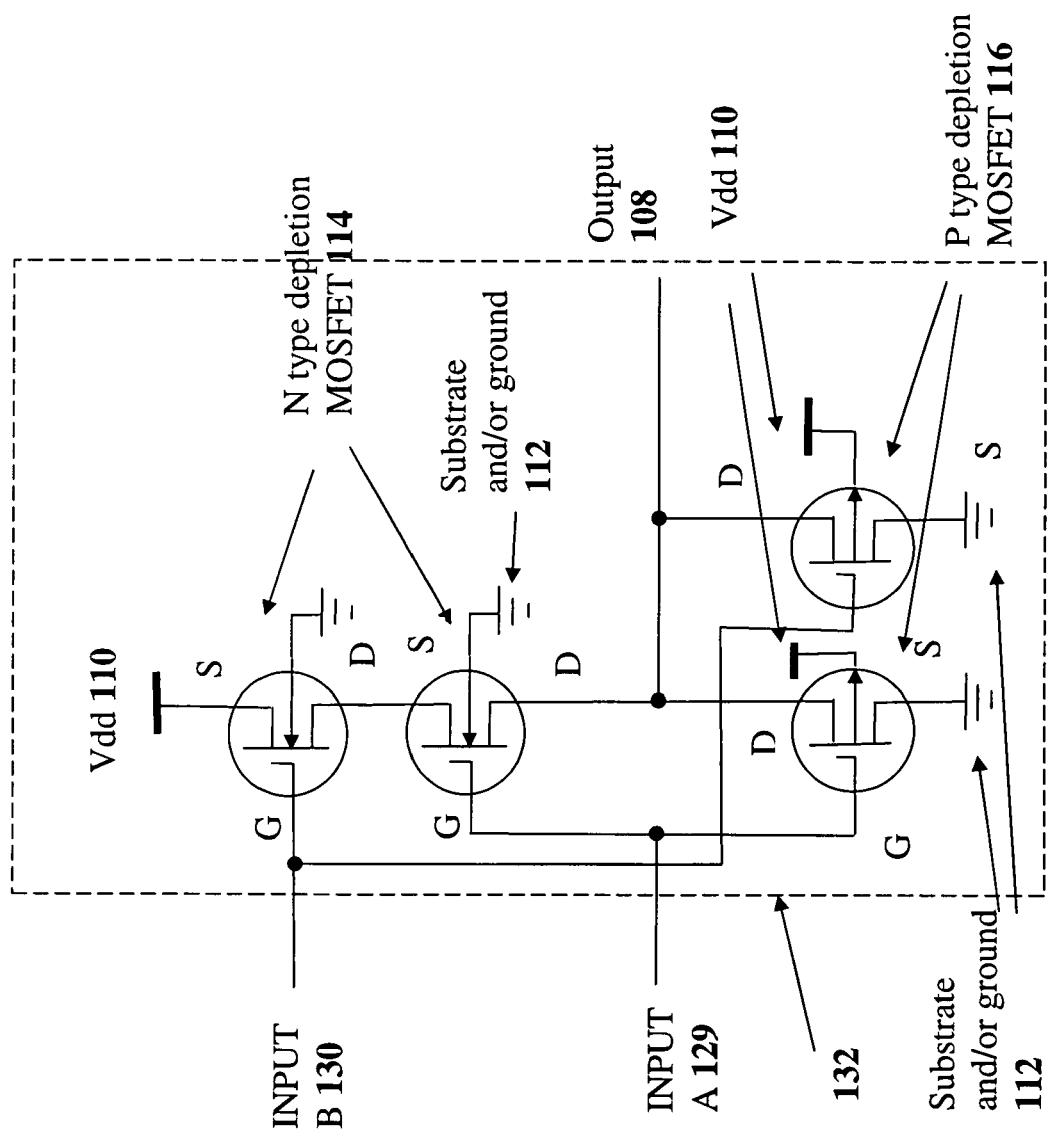
FIG. 10, the schematic diagram of an AND logic gate using depletion type MOSFETs.

A positive AND logic gate 132 can be built with two N depletion type MOSFETs 114 and two P depletion type 116 MOSFETs as shown in FIG. 10. In this design, the two N depletion type MOSFETs 114 are connected in series and the two P depletion type MOSFETs 116 are connected in parallel so that the output 108 will be shorted to ground at low logic level when either one of the input A 129 or input B 130 is at a low logic level. The output 108 can only become high logic level when both of the input A 129 and input B 130 are at a high logic level to short the output 108 to Vdd 110. A positive AND logic 132 is thus achieved.

In a preferred embodiment, the positive AND logic gate includes a first and second N type depletion MOSFET transistor, and a first and second P type depletion MOSFET transistor. A first input terminal is coupled to a gate terminal of the first P type depletion MOSFET transistor and to a gate terminal of the second N type depletion MOSFET transistor. A second input terminal is coupled to a gate terminal of the first N type depletion MOSFET transistor and to a gate terminal of the second P type depletion MOSFET transistor. A positive voltage supply terminal is coupled to a source terminal of said first N type depletion MOSFET transistor and to a substrate terminal of both the first and second P type depletion MOSFET transistors. A ground terminal is coupled to a source terminal of both the first and second P type depletion MOSFET transistors, and to a substrate terminal of both the first and second N type depletion MOSFET transistors. An output terminal is coupled to a drain terminal of both the first and second P type depletion MOSFET transistors and to a drain terminal of the second N type depletion MOSFET transistor, thereby creating an AND Boolean logic circuit.

OR LOGIC GATE

Figure 11:
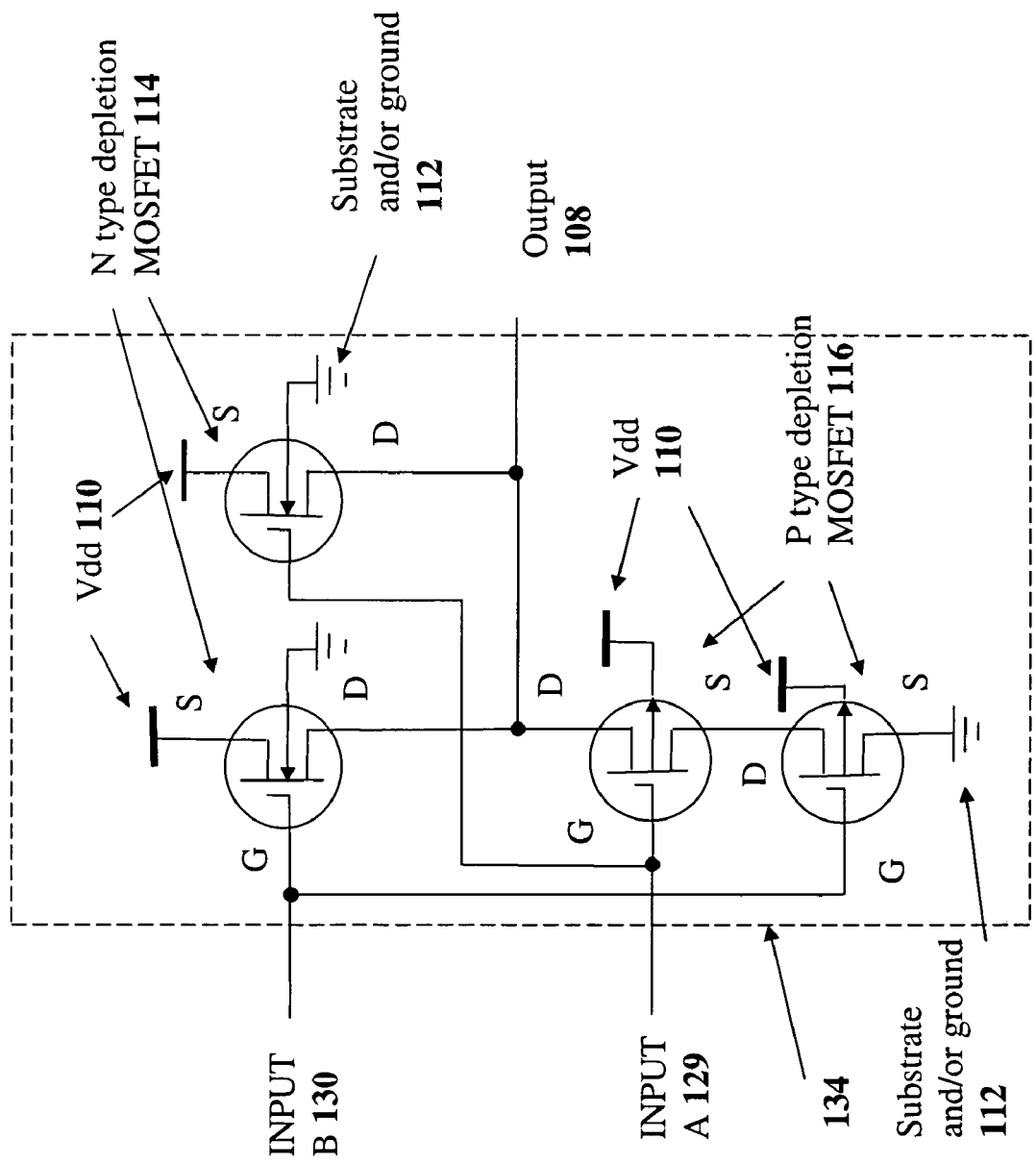
FIG. 11, the schematic diagram of an OR logic gate using depletion type MOSFETs.

A positive OR logic gate 134 can be built with two N depletion type MOSFETs 114 and two P depletion type 116 MOSFETs as shown in FIG. 11. In this design, the two P depletion type MOSFETs 116 are connected in series and the two N depletion type MOSFETs 114 are connected in parallel so that the output 108 will be shorted to Vdd 110 at high logic level when either one of the input A 129 or input B 130 is at a high logic level. The output 108 can only become low logic level when both of the input A 129 and input B 130 are at a low logic level to short the output 108 to ground and/or substrate 112. A positive OR logic gate 134 is thus achieved.

In a preferred embodiment, the positive OR logic gate includes a first and second N type depletion MOSFET transistor, and a first and second P type depletion MOSFET transistor. A first input terminal is coupled to a gate terminal of the first P type depletion MOSFET transistor and to a gate terminal of the second N type depletion MOSFET transistor. A second input terminal is coupled to a gate terminal of the first N type depletion MOSFET transistor and to a gate terminal of the second P type depletion MOSFET transistor. A positive voltage supply terminal is coupled to a source terminal of both the first and second N type depletion MOSFET transistors and to a substrate terminal of both the first and second P type depletion MOSFET transistors. A ground terminal is coupled to a source terminal of the second P type depletion MOSFET transistor, and to a substrate terminal of both the first and second N type depletion MOSFET transistors. An output terminal is coupled to a drain terminal of the first P type depletion MOSFET transistor and to a drain terminal of both the first and second N type depletion MOSFET transistors, thereby creating an OR Boolean logic circuit.

MASTER-SLAVE FLIP-FLOP

Figure 12:
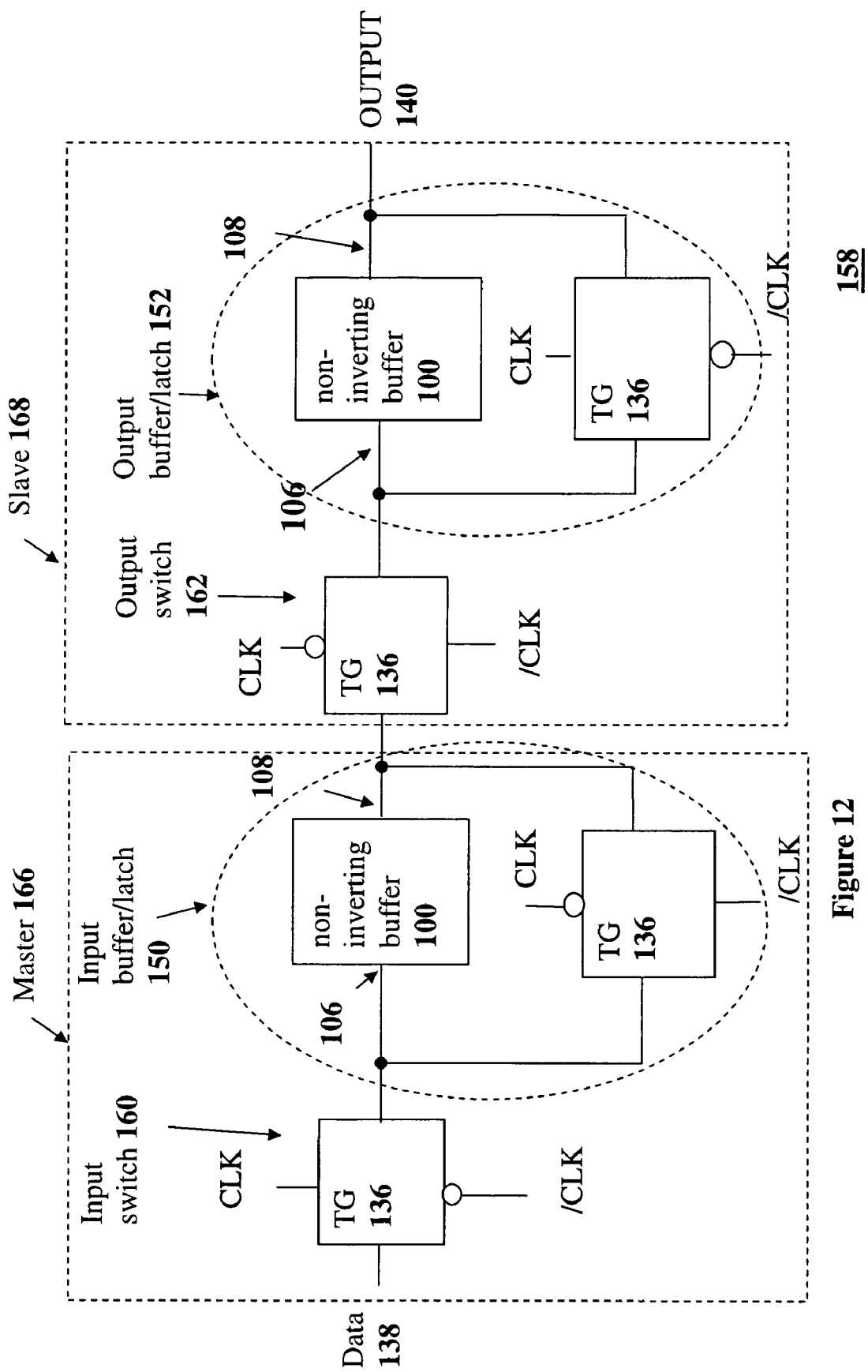
FIG. 12, the schematic diagram of a basic master-slave flip-flop.

The master-slave flip-flop is used extensively in almost all logic design since it can supply a reliable data sample. A basic master-slave flop-flop 158 is made of two sections, a master section 166 and a slave section 168 as shown in FIG. 12. Both the master section 166 and the slave 168 section are made of a data switch and a buffer/latch circuit. Both the master section 166 and the slave section 168 toggle between the buffer mode to accept the data and latch mode to deliver the data alternatively out-of-phase so that when the master section 166 is in the buffer mode, the slave section 168 will be in the latch mode and vice versa. Each of the master section 166 or the slave section 168 alone can also be used as a clocked latch by itself.

When the clock input is in the logic high level, the master section 166 will be in the buffer mode and the data input 138 is allowed to be passed to the non-inverting buffer/latch 150 through the input switch 160. During this period, the feedback path of the input buffer/latch 150 is opened so that the input buffer/latch 150 is in the buffer mode. As soon as the clock input changes the state to become logic low level, the input switch 160 will be opened and the feedback path of the input buffer/latch 150 will be closed and the input buffer/latch 150 will be switched to the latch mode and the data input 138 is latched. At the same time, the output switch 162 will be closed to allow the latched input data to be passed to the output 140 through the output buffer/latch 152 which is currently in the buffer mode since its feedback path is opened. But as soon as the clock input changes the state to become logic high level again, the output switch 162 becomes opened and the feedback path of the output buffer/latch 152 will be closed and the output buffer/latch 152 will stay in the latch mode to maintain the same data to the output 140. As a result, the data input 138 is sampled when the clock is at high logic level and is delivered to the output 140 when the clock is at low logic level and the negative falling edge of the clock signal effectively triggers the sampling of input data 138.

Traditionally when the master-slave flip-flop is built with the enhancement type MOSFET, two inverters that each is made of two enhancement MOSFETs are needed to form the buffer/latch circuit due to the lack of positive logic output as explained earlier in the 3T-SRAM section. The use of two inverters to form a non-inverting buffer/latch in a master-slave flip-flop does not only take more room but also add more propagation delay to the output signal, require longer setup time before the trigger and longer hold time after the trigger to ensure the data integrity and consume more power. The positive non-inverting buffer 100 is thus ideal to be used for the buffer/latch of the master-slave flip-flop 158.

Figure 13:
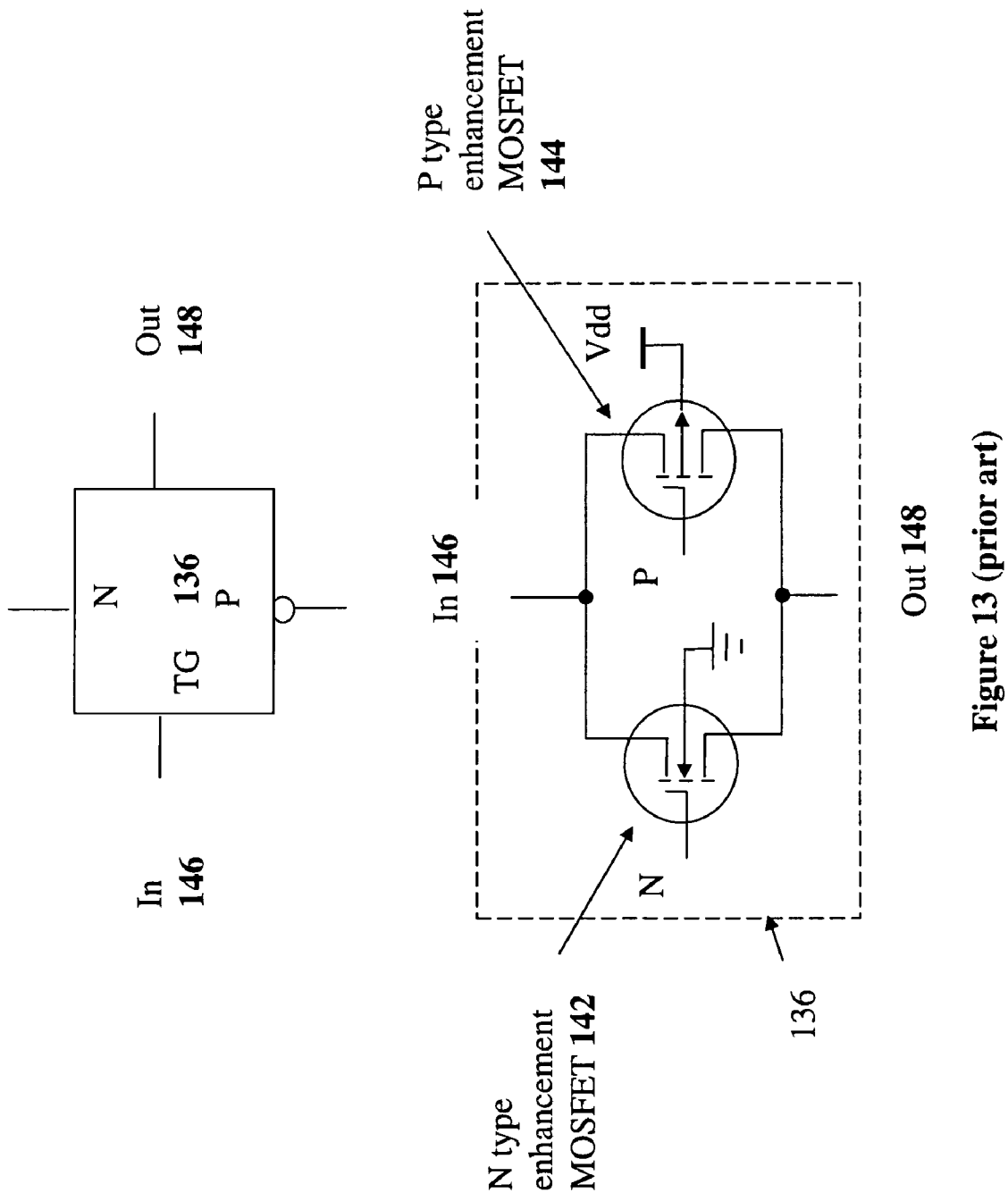
FIG. 13, the schematic diagram for T-gate (prior art).

The design of the basic master-slave flip-flop 158 as illustrated in FIG. 12 requires four T-gates 136 to complete the design. A T-gate 136 is made of two enhancement type MOSFET transistors as shown in FIG. 13. A T-gate 136 has two complementary control inputs and two I/O pins, an input 146 and an output 148. Since the I/O pins of T-gate 136 are not polarized, the input 146 and output 148 are bi-directional. The purpose of the T-gate 136 is to allow the passage of data from the input 146 to the output 148 of the T-gate 136 when the T-gate 136 is enabled and to disrupt the passage of data when the T-gate 136 is disabled. The T-gate 136 will be enabled only when the N input of the T-gate 136 is at high logic level while the P input is at a low logic level at the same time. When the T-gate 136 is enabled, a high level logic input will be passed from the input 146 to the output 148 of the T-gate 136 through the P type enhancement MOSFET 144 and a low level logic input will be passed from the input 146 to the output 148 of the T-gate 136 through the N type enhancement MOSFET 142. To disable the T-gate 136, the N input of the T-gate 136 must be at a logic low level while the P input of the T-gate 136 must be at a logic high level at the same time. When the T-gate 136 is disabled, there is no passage between the input 146 and output 148 of the T-gate 136. As a result, the T-gate 136 is simply a single-pole-single-throw switch.

Mixing the use of depletion type and enhancement type MOSFET produces a basic master-slave flip-flop 158 built with the least possible amount of hardware. The mixed master-slave flip-flop 158 is superior to the traditional master-slave flip-flop built with only the enhancement type MOSFET because the mixed master-slave flip-flop 158 requires half of the setup time and hold time so that it can toggle the output signal at twice the rate. The basic master-slave flip-flop 158 is thus the best example to show why the depletion type MOSFET is important to achieve an optimal logic design.

Figure 14:
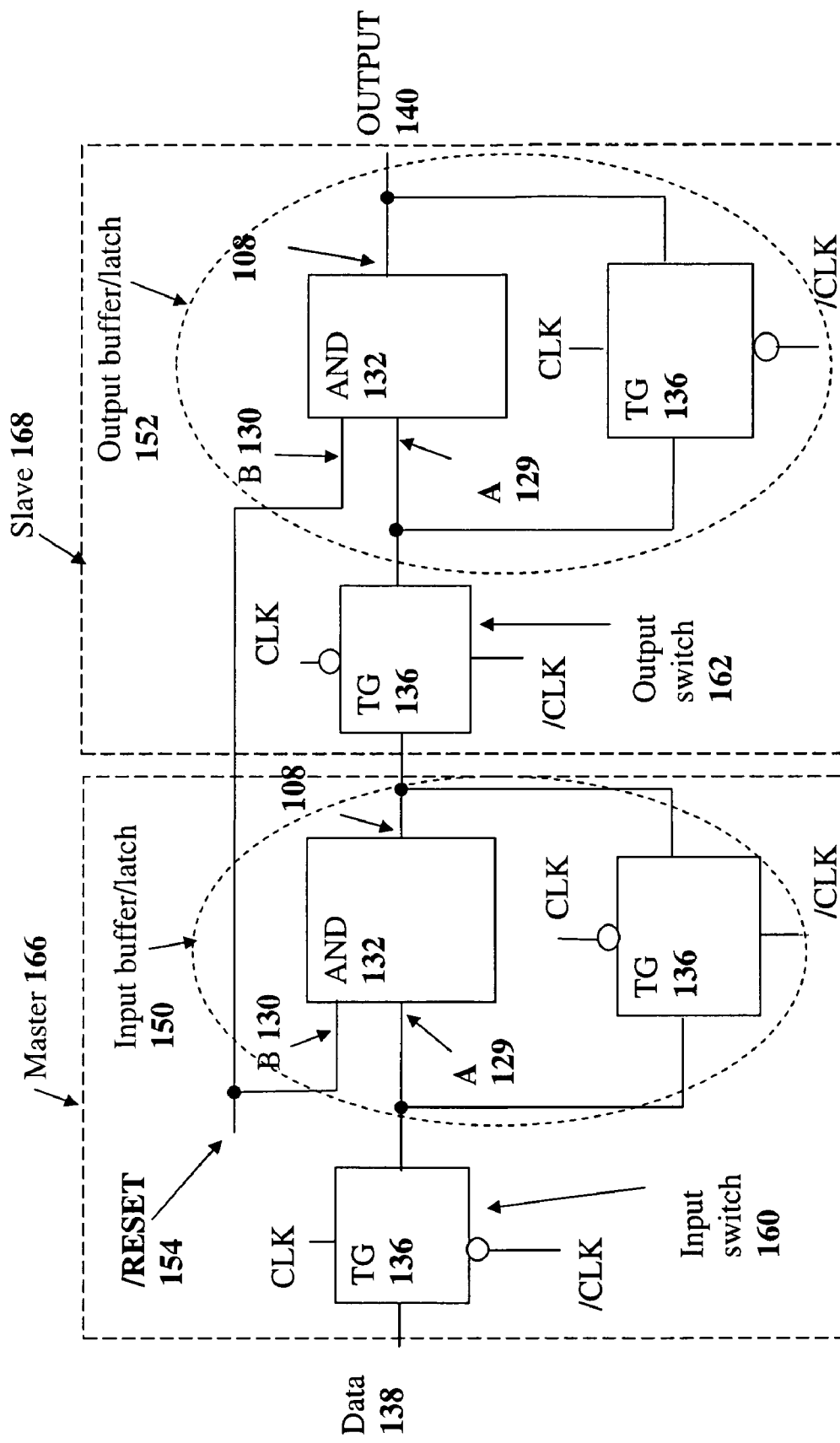
FIG. 14, the schematic diagram for a master-slave flip-flop with reset input.
Figure 15:
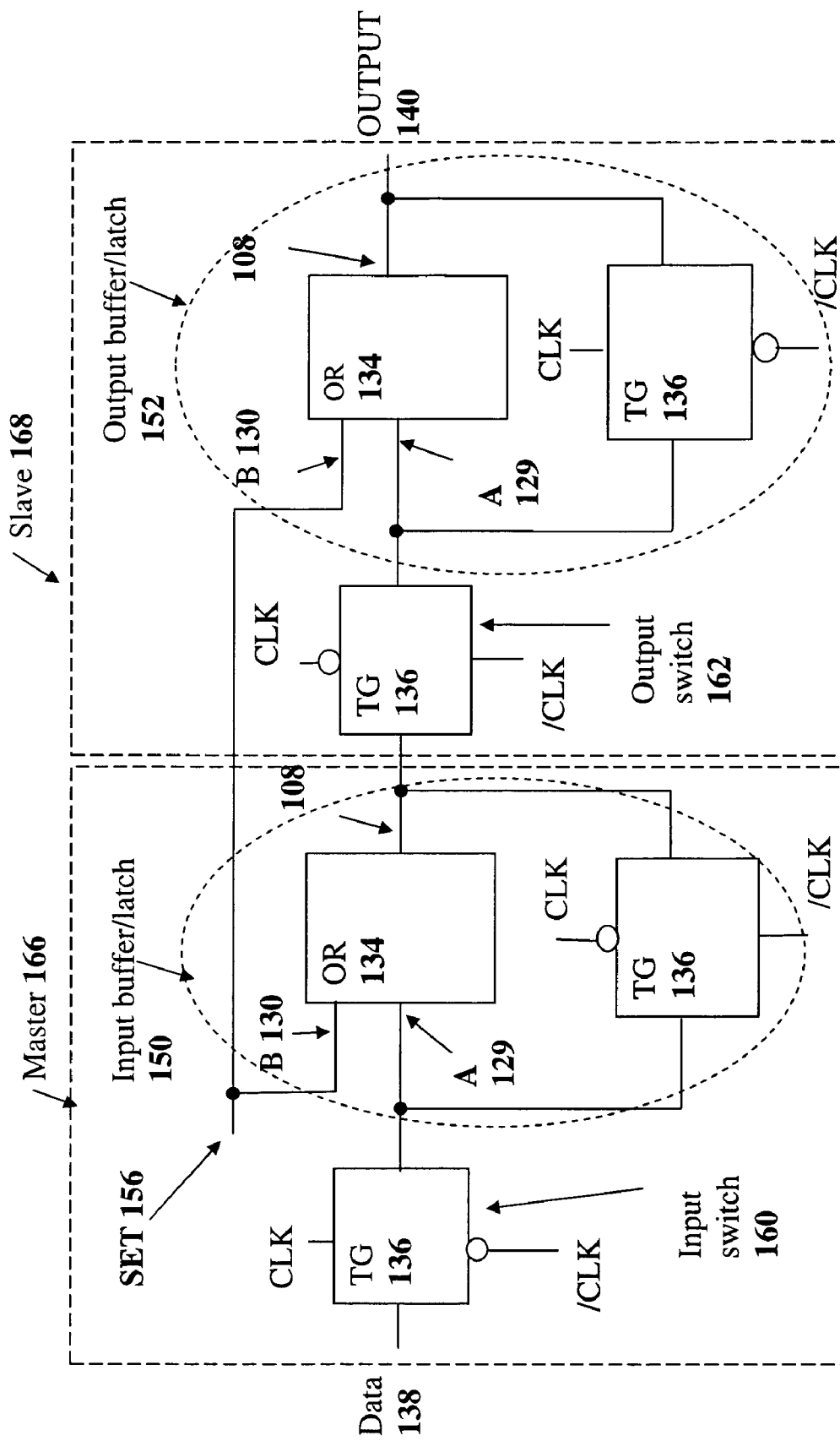
FIG. 15, the schematic diagram for a master-slave flip-flop with set input.

Addition Set 156 or /Reset 154 input can be added to the basic master-slave flip-flop as shown in FIG. 14 and 15. The non-inverting buffer 100 will need to be replaced by either the non-inverting AND 132 or non-inverting OR 134 to allow for the additional set 156 or /reset 154 input pins. Other than the additional set 156 or /reset 154 input pins to set or reset the master-slave flip-flops, 170 and 172; the two master-slave flip-flops, 170 and 172, behave exactly the same as the basic master-slave flip-flop 158.

ALTERNATIVE EMBODIMENTS

Figure 16:
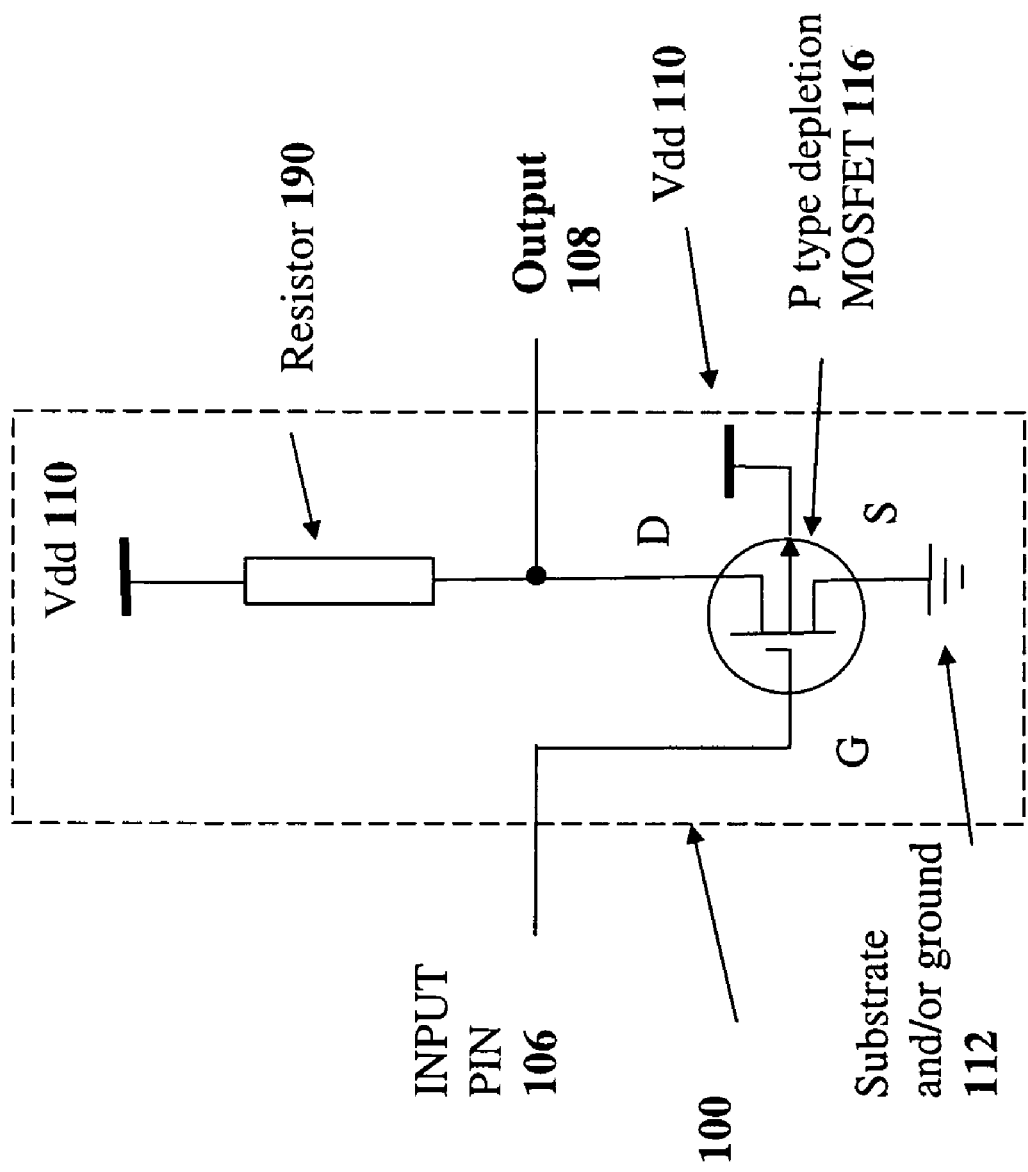
FIG. 16, the schematic diagram of a non-inverting buffer using a P type depletion MOSFET and a resistor.
Figure 17:
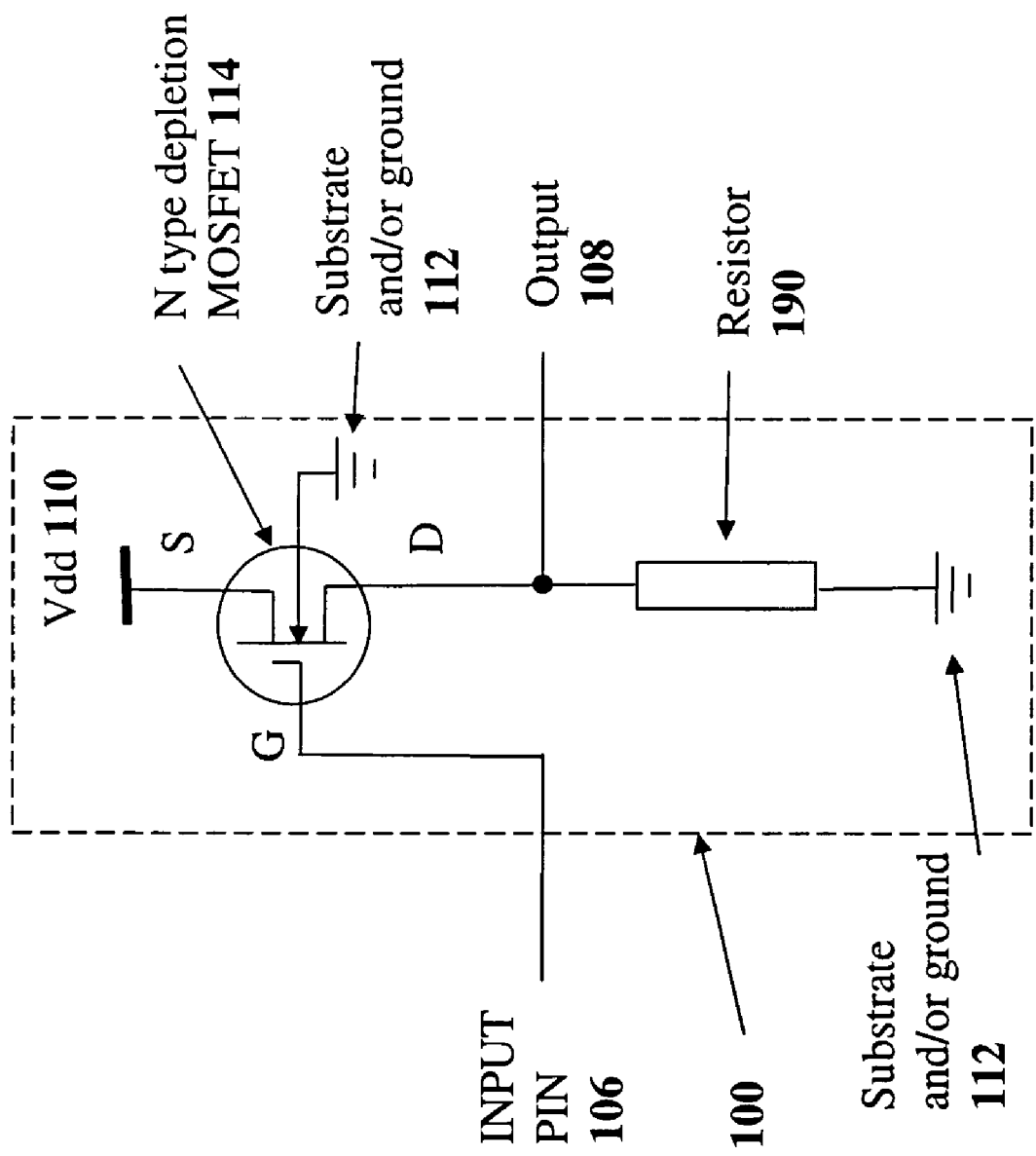
FIG. 17, the schematic diagram of a non-inverting buffer using an N type depletion MOSFET and a resistor.

The non-inverting buffer 100 can also be built by two other ways as shown in FIG. 16 and 17 by using a resistor 190 to replace one of the MOSFETs. In the design as shown in FIG. 16, when the input 106 is at logic high, the P type depletion MOSFET 116 will be pinched-off and remain in the high impedance state and the output voltage at output pin 108 will be pulled to the Vdd 110 by the loading resistor 190 and the only current consumed is the pinch-off current through the P type depletion MOSFET 116. When the input 106 is at logic low, the drain of the P type depletion MOSFET 116 will be shorted to ground and the output pin 108 will remain at logic low. A current through the loading resistor 190 will thus be consumed when the state of output pin 108 is logic low. Likewise, for the design as shown in FIG. 17, when the input is at logic high, the drain of the N type depletion MOSFET 114 will be shorted to the Vdd power supply line 110 and a current through the loading resistor 190 will be consumed when the state of output pin 108 is logic high. When the input 106 is at logic low, the N type depletion MOSFET 114 will be pinched off and remain in the high impedance state and the output 108 will become logic low and little current is consumed.

In a particular embodiment of the one-transistor, one-resistor non-inverting buffer, the depletion MOSFET transistor is an N type transistor having a gate terminal coupled to an input terminal, a drain terminal coupled to an output terminal, a substrate terminal coupled to a ground terminal and a source terminal coupled to a positive voltage supply terminal. There is also a resistor having a first terminal coupled to the drain terminal of the N type depletion MOSFET transistor, and a second terminal coupled to the ground terminal, thereby forming a one-transistor, one-resistor, non-inverting buffer.

Figure 18:
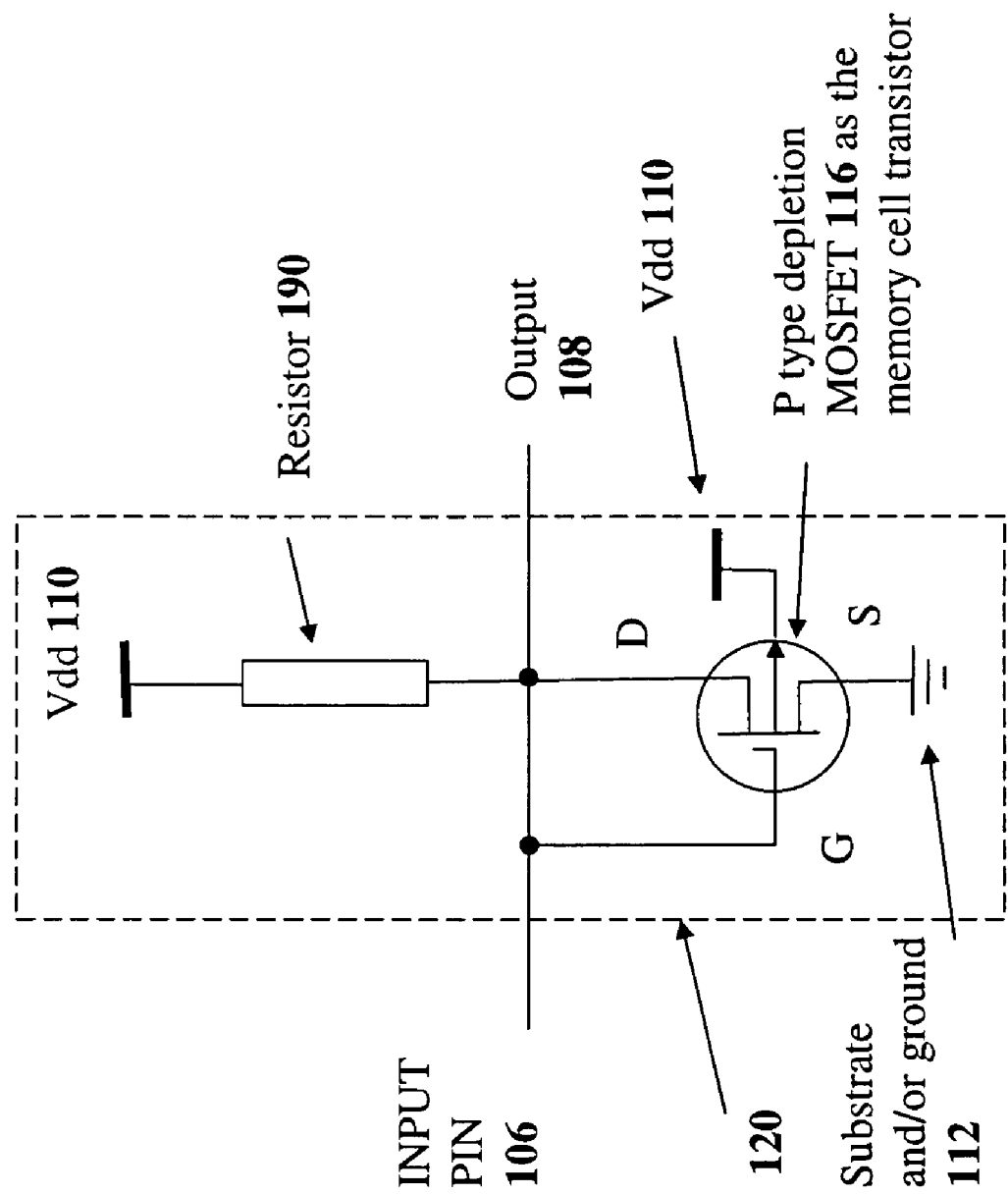
FIG. 18, the schematic diagram of a latch using a P type depletion MOSFET and a resistor.
Figure 19:
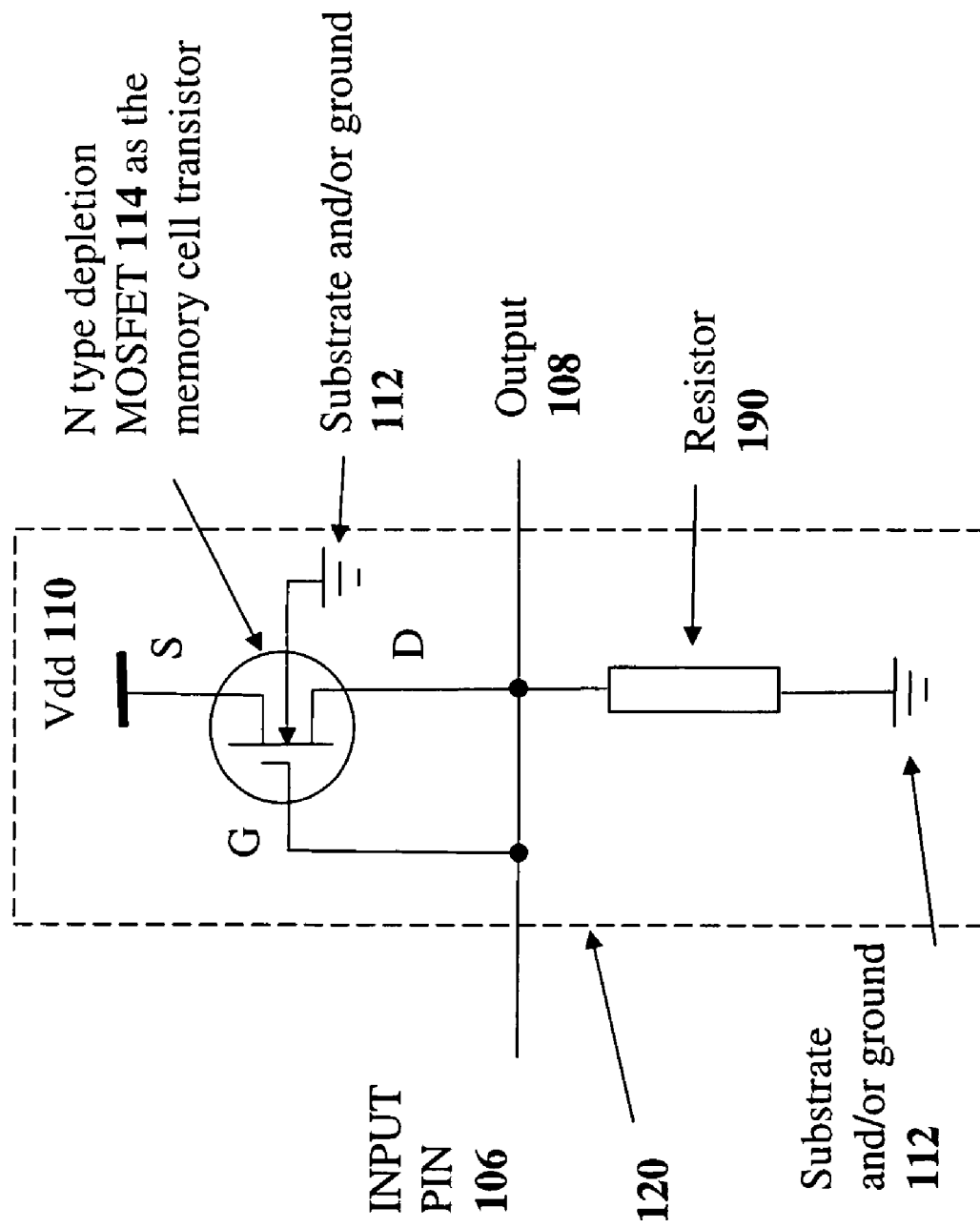
FIG. 19, the schematic diagram of a latch using an N type depletion MOSFET and a resistor.

Consequently, the non-inverting latch 120 can also be built with a depletion type MOSFET and a resistor 190 as shown in FIGS. 18 and 19. The disadvantage of using a resistor 190 is that it can take a large room to build a large resistor 190 since a small resistor will consume more current and should be avoided. The only advantage of using a resistor 190 to replace the depletion type MOSFET is to save the N-well or P-well. An N-well or a P-well is inevitable when both N type and P type MOSFETs are used and an N-well or a P-well can occupy a large room. Using a resistor and only one kind of MOSFET without a well might increase the density of memory cell.

Figure 20:
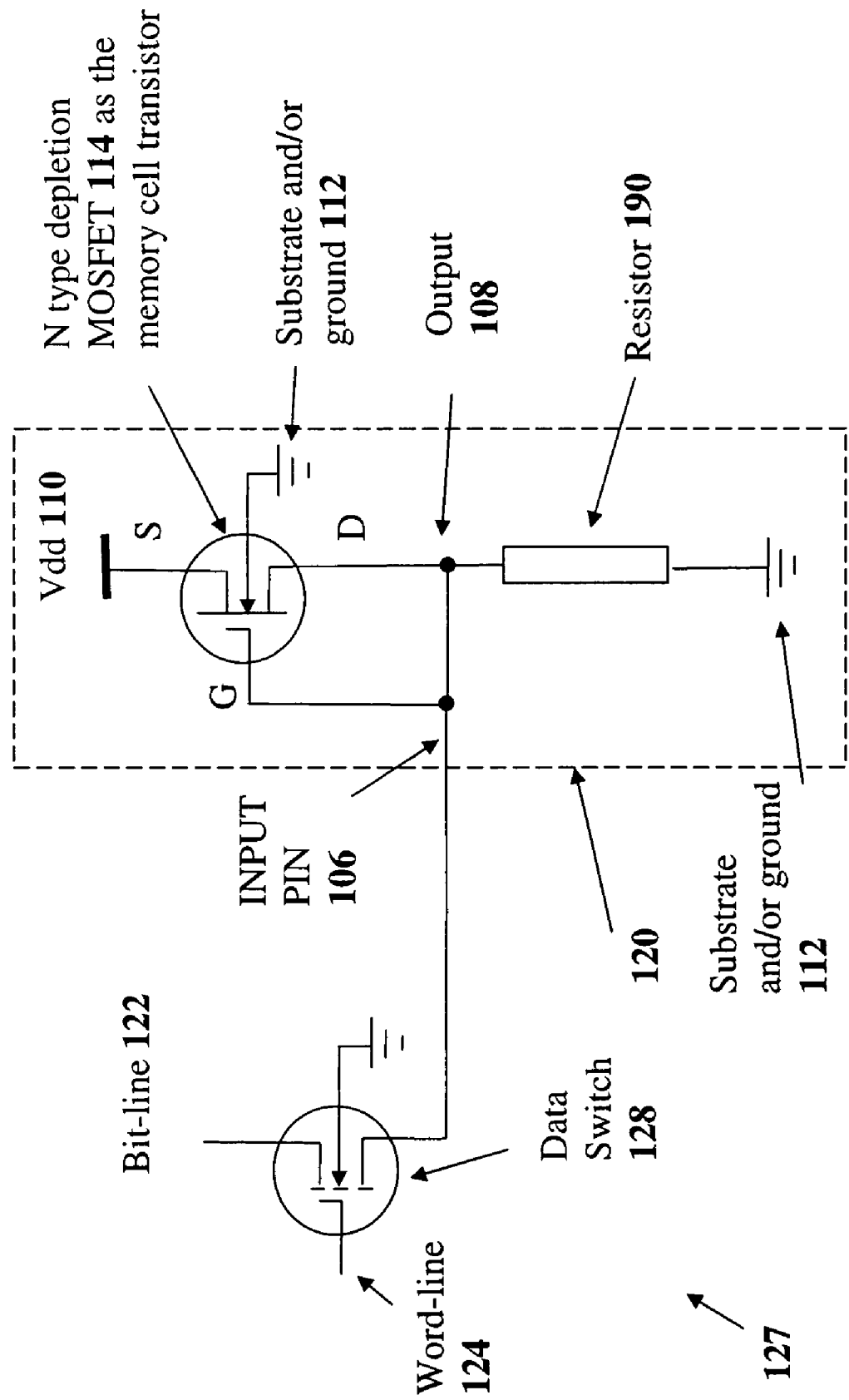
FIG. 20, the schematic diagram of a 2T1R-SRAM cell using N type depletion MOSFET as an alternate embodiment.
Figure 21:
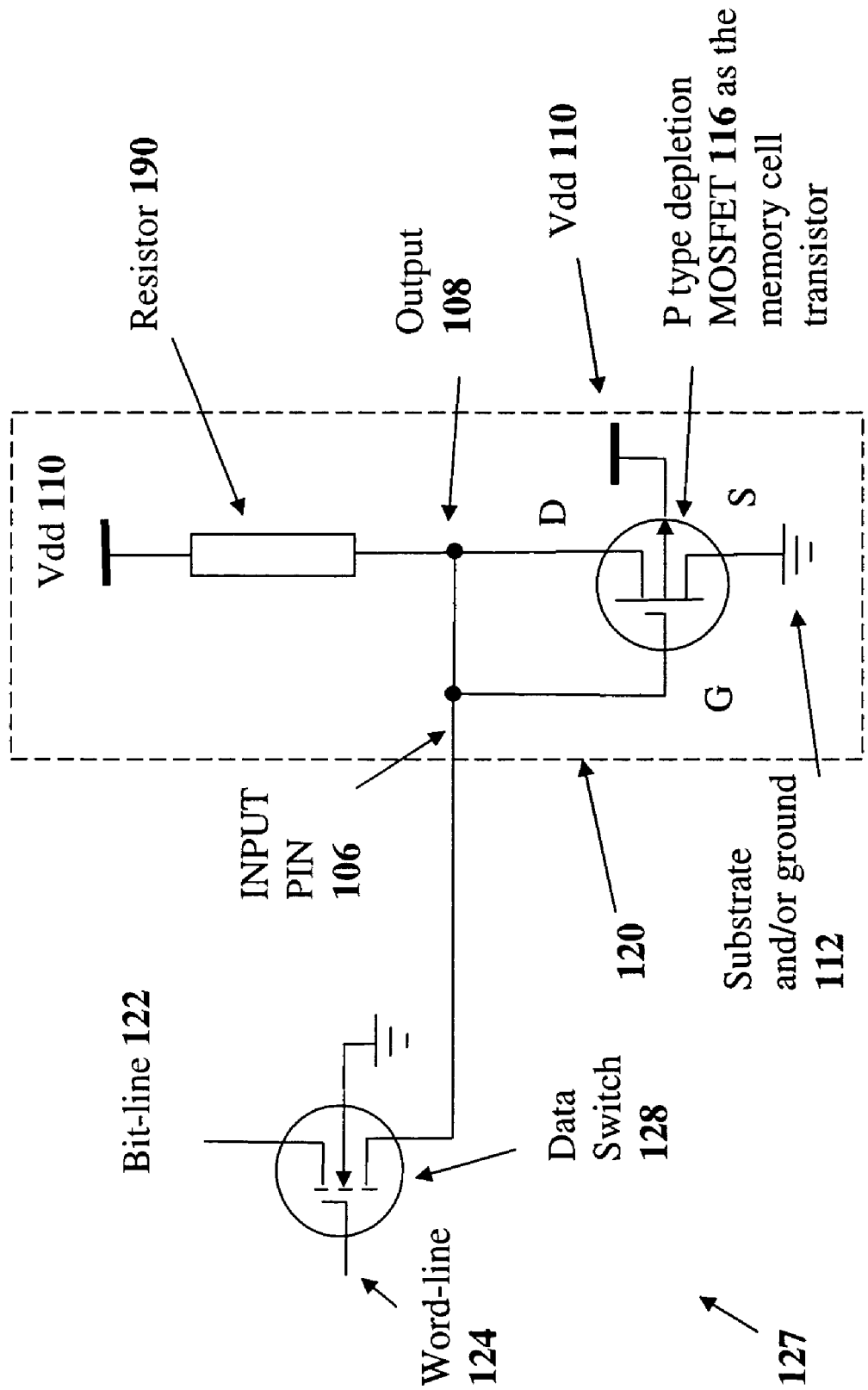
FIG. 21, the schematic diagram of a 2T1R-SRAM cell using P type depletion MOSFET as an alternate embodiment.

The resistor 190 can be made in many different ways, for example, by using a poly resistor or a well resistor or a transistor as an active load. The SRAM memory cell can thus be called 2T1R-SRAM 127 when one of the MOSFETs of the memory cell 120 is replaced with a resistor as shown in FIG. 20 and 21.

In a particular embodiment of the 2T1R-SRAM, there is an N type depletion MOSFET transistor having a substrate terminal coupled to a ground terminal and a source terminal coupled to a positive voltage supply terminal and a resistor having a first terminal coupled to the drain terminal of the N type depletion MOSFET transistor, and a second terminal coupled to the ground terminal. The gate terminal of the N type depletion MOSFET transistor is coupled to its drain terminal. There is also an N type enhancement MOSFET transistor having one of a drain/source terminal coupled to the gate terminal of the N type depletion MOSFET transistor, a substrate terminal coupled to the ground terminal, the other of the drain/source terminal coupled to a data line and a gate terminal coupled to an address line, thereby forming a two-transistor, 1 resistor, static random access memory.

In an alternate embodiment of the 2T1R-SRAM, there is a P-type depletion MOSFET transistor having a substrate terminal coupled to a positive voltage supply terminal and a source terminal coupled to a ground terminal. There is also a resistor having a first terminal coupled to the drain terminal of the P type depletion MOSFET transistor, and a second terminal coupled to the positive voltage supply terminal. The gate terminal of the P type depletion MOSFET transistor is coupled to its drain terminal. There is also an N type enhancement MOSFET transistor having a drain terminal coupled to the gate terminal of the P type depletion MOSFET transistor, a substrate terminal coupled to the ground terminal, a source terminal coupled to a data line and a gate terminal coupled to an address line, thereby forming a two-transistor, one resistor static random access memory.

Figure 22:
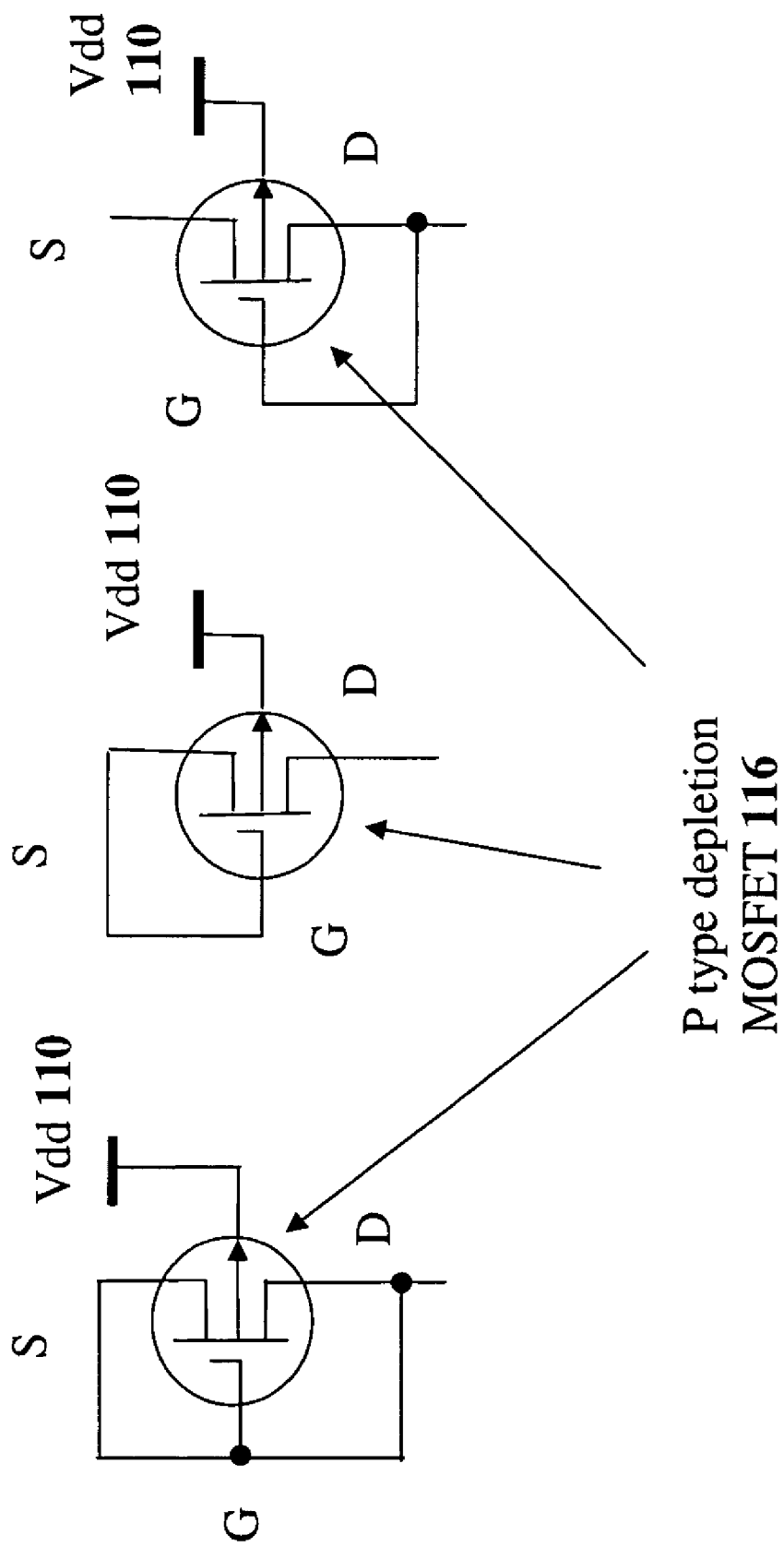
FIG. 22, the schematic diagram of a reverse-biased diode using P-type depletion MOSFET.
Figure 23:
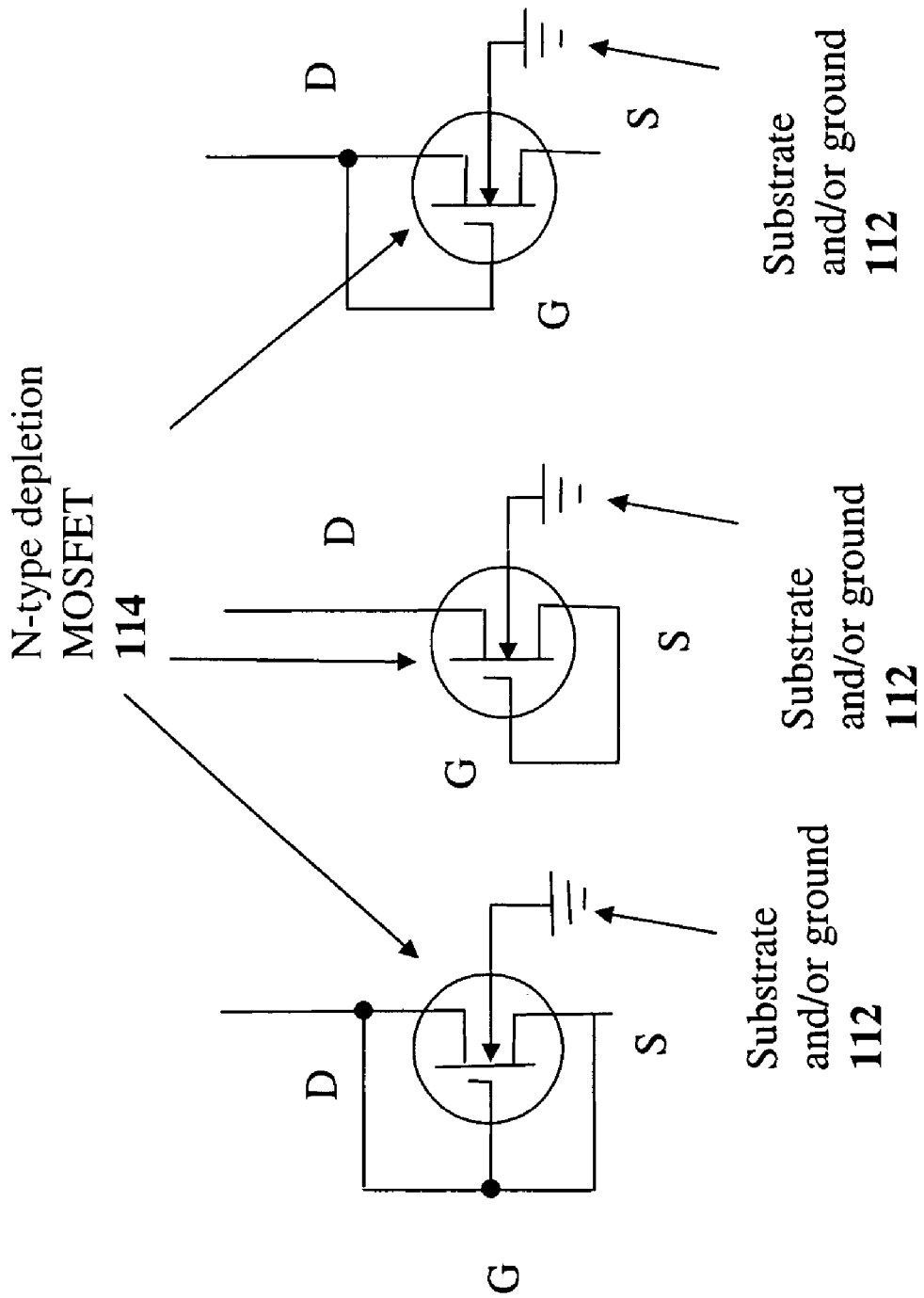
FIG. 23, the schematic diagram of a reverse-biased diode using N-type depletion MOSFET.

The resistor 190 can also be replaced by a reverse-biased diode which is equivalent to a resistor with very high impedance. The reverse-biased diode can be made in many ways inside the IC since it is simply a reverse-biased P-N junction. FIG. 22 illustrates some of the possible ways to produce a reverse-biased diode using the P-type depletion MOSFET 116 and FIG. 23 illustrates some of the possible ways to produce a reverse-biased diode using N-type depletion MOSFET 114. For a memory cell that uses a reverse-biased diode as the loading resistor, the leakage current flows in from the bulk to the drain-to-source channel of the reverse-biased diode or flows out from the drain-to-source channel of the reverse-biased diode to the bulk must be much larger than the pinch-off current of the memory cell transistor to prevent the pinch-off current of the memory cell transistor from altering the state of the stored data. For example, in the design of 2T1R-SRAM cell 127 as shown in FIG. 20 using a reversed-biased diode made by a N-type depletion MOSFET 114 as shown in FIG. 23 as the loading resistor 190; when the state of memory cell 120 is logic high, the state of high logic output is retained by the memory cell transistor 114 so that it will remain at logic high output indefinitely as long as the power supply is active. However, when the state of the memory cell 120 is logic low, the state of low logic output is retained by the stray capacitance at the output pin 108. Since the pinch-off current through the drain-to-source channel of the memory cell transistor 114 and the leakage current from the high logic input state at the bit-line 122 through the data switch transistor 128 can pump up the low logic output at the output pin 108, these two currents can alter the state of the low level logic output at the output pin 108. Fortunately, if the leakage current to the bulk through the reverse-biased diode is larger than the sum of the pinch-off current from the memory cell transistor 114 and the leakage current from the high logic input state at the bit-line 122 through the data switch transistor 128, the logic low output at the output pin 108 will not be charged up and the logic low output state can be retained indefinitely. Likewise, in the design of 2T1R-SRAM memory cell 127 as shown in FIG. 21 using reverse-biased diode made by P type depletion MOSFET 116 as shown in FIG. 22 to replace the loading resistor 190, when the state of the memory cell 120 is logic low, the state of the logic low output is retained by the memory cell transistor 116 so that it will remain logic low indefinitely; however, when the state of the memory cell 120 is logic high, the state of logic high output is retained by the stray capacitance at the output pin 108. Since the pinch-off current through the memory cell transistor 116 and the leakage current to the low logic input state at the bit-line 122 through the data switch transistor 128 can discharge voltage stored on the stray capacitance, the logic high output at output pin 108 can be altered. Fortunately, if the sum of the pinch-off current of the memory cell transistor 116 and the leakage current to the logic low input state at the bit-line 122 through the data switch transistor 128 is smaller than the leakage current from the bulk to the drain of the reverse-biased diode, the voltage on the stray capacitance at the output pin 108 will not be discharged by the pinch-off current of the memory cell transistor 116 and the leakage current to the logic low input state at the bit-line 122 through the data switch transistor 128 and the logic high output state at output pin 108 will be retained indefinitely as long as the power supply line is active.

Figure 24:
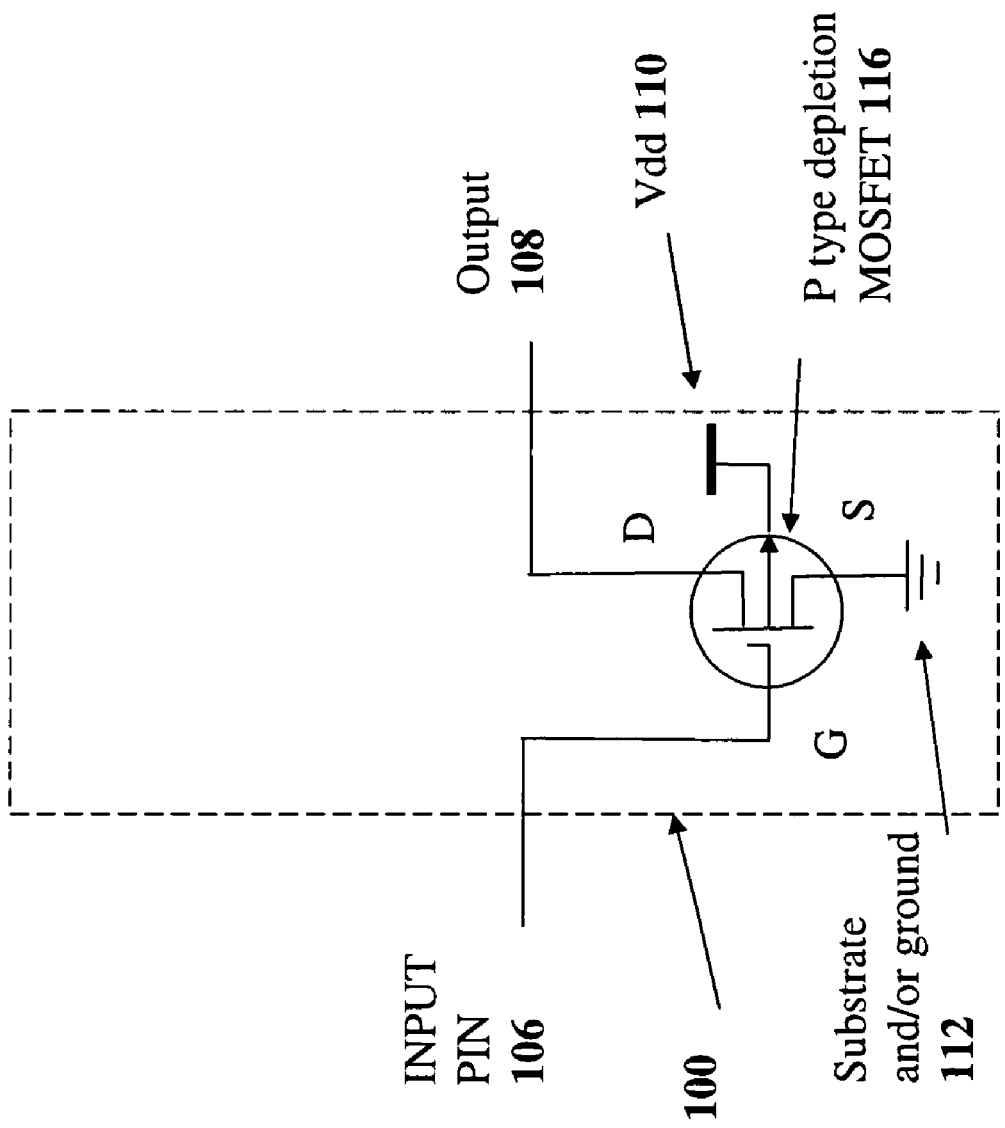
FIG. 24, the schematic diagram of a non-inverting buffer using a single P type depletion MOSFET.
Figure 25:
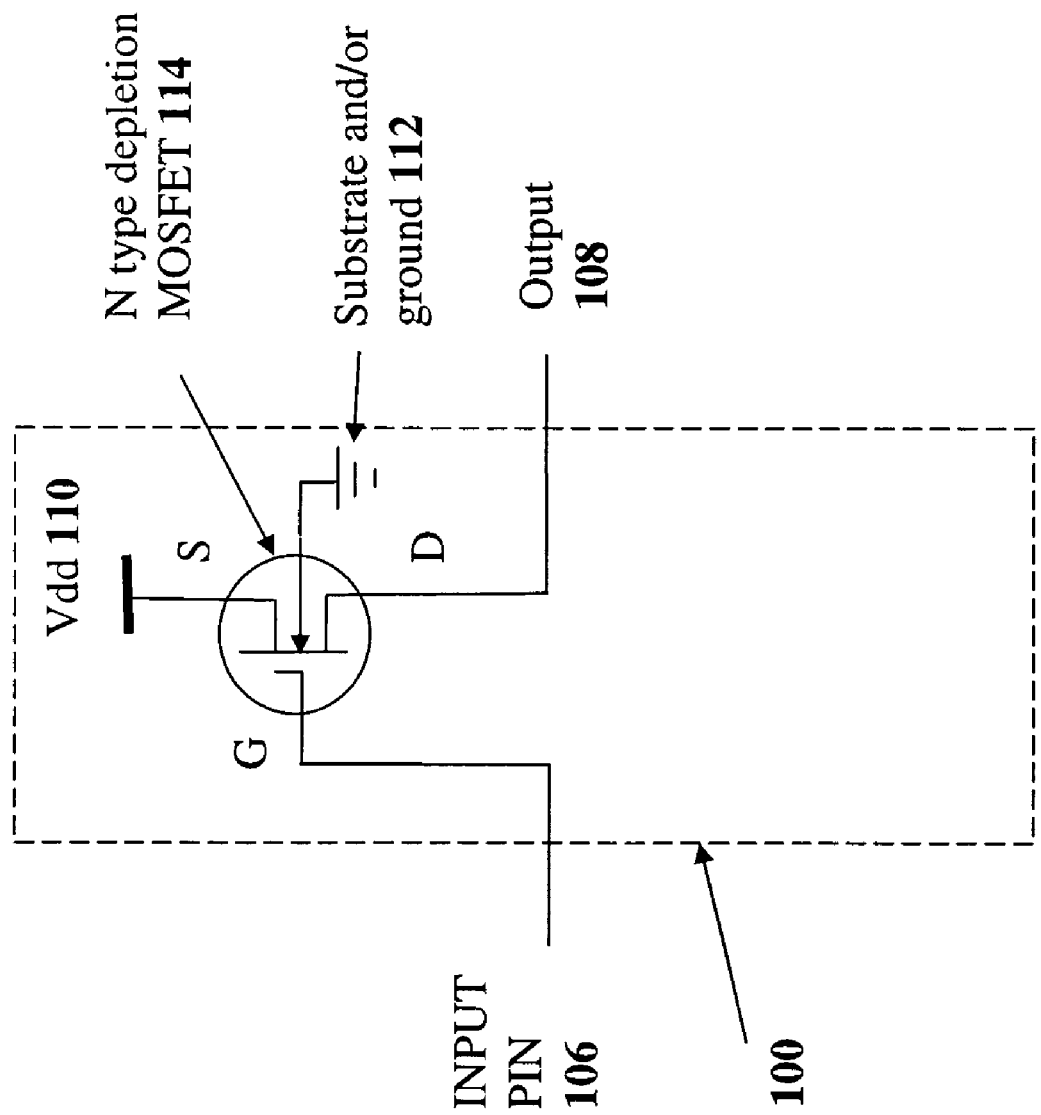
FIG. 25, the schematic diagram of a non-inverting buffer using a single N type depletion MOSFET.
Figure 26:
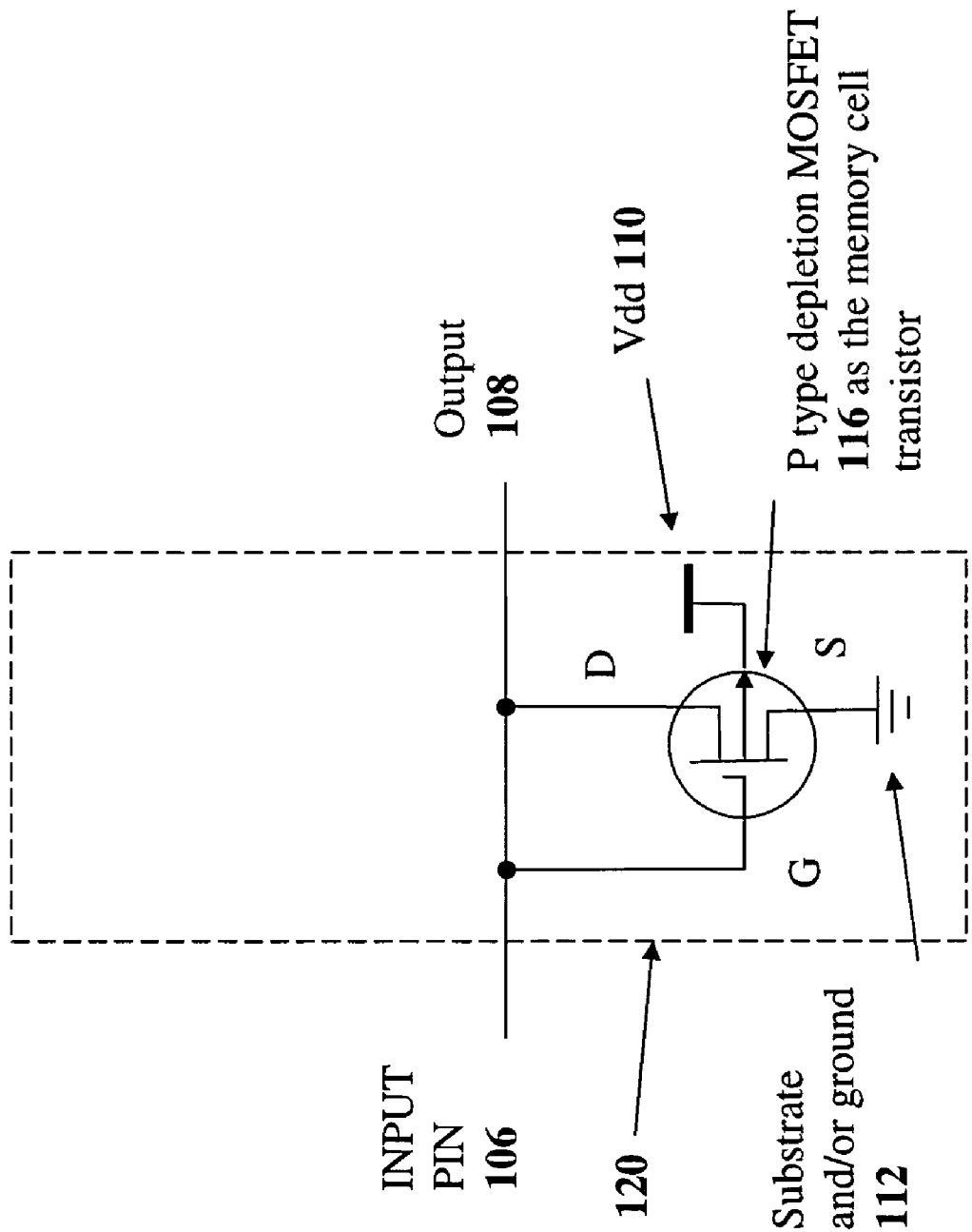
FIG. 26, the schematic diagram of a latch using a single P type depletion MOSFET.
Figure 27:
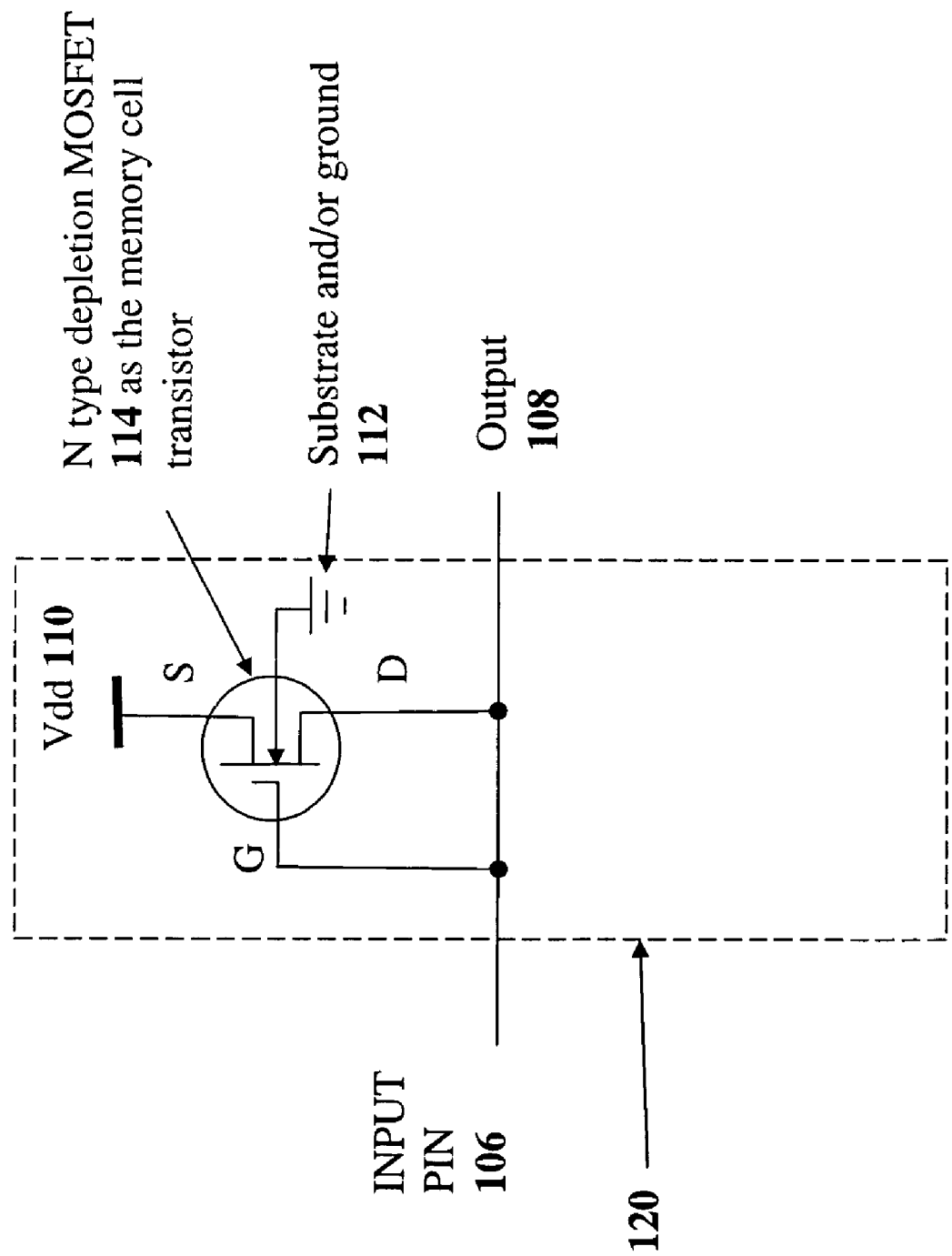
FIG. 27, the schematic diagram of a latch using a single N type depletion MOSFET.

Since the drain of the reverse-biased diode is the same as the drain of the memory cell transistor, the reverse-biased diode can be eliminated. As a result, the loading resistor 190 of the non-inverting buffer 100 as shown in FIG. 16 and 17 can even be eliminated completely as shown in FIG. 24 and 25 if the leakage current from the bulk to the drain of the memory cell transistor 116 or from drain of the memory cell 114 to the bulk is much larger than the pinch-off current so that the pinch-off current will not alter the output state. Consequently, the non-inverting latch 120 using only a single depletion MOSFET can be shown in FIG. 26 and 27 and 2T-SRAM memory cell 131 can be shown as in FIG. 28 and 29.

Figure 28:
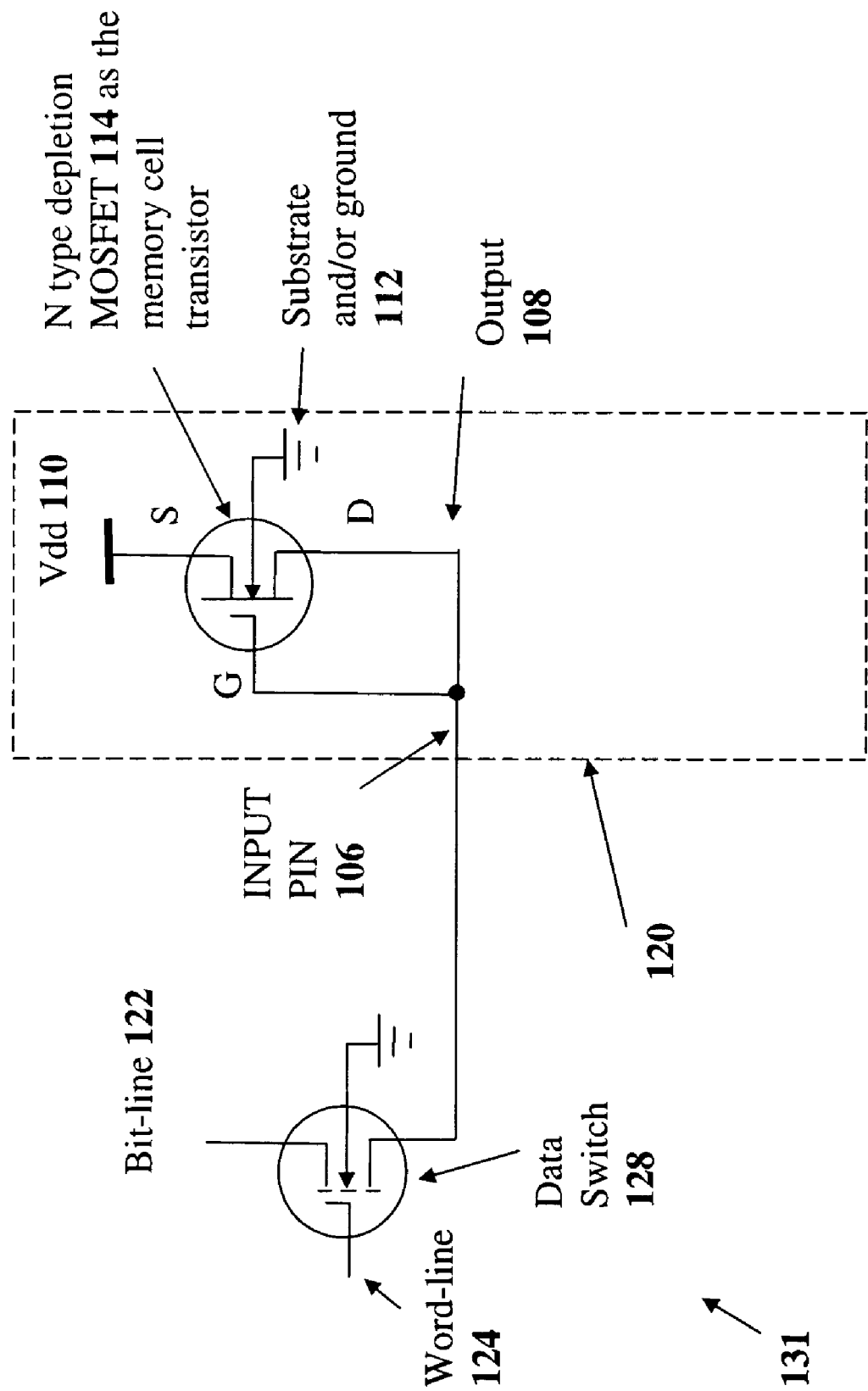
FIG. 28, the schematic diagram of a 2T-SRAM cell using a single N type depletion MOSFET as an alternate embodiment.
Figure 29:
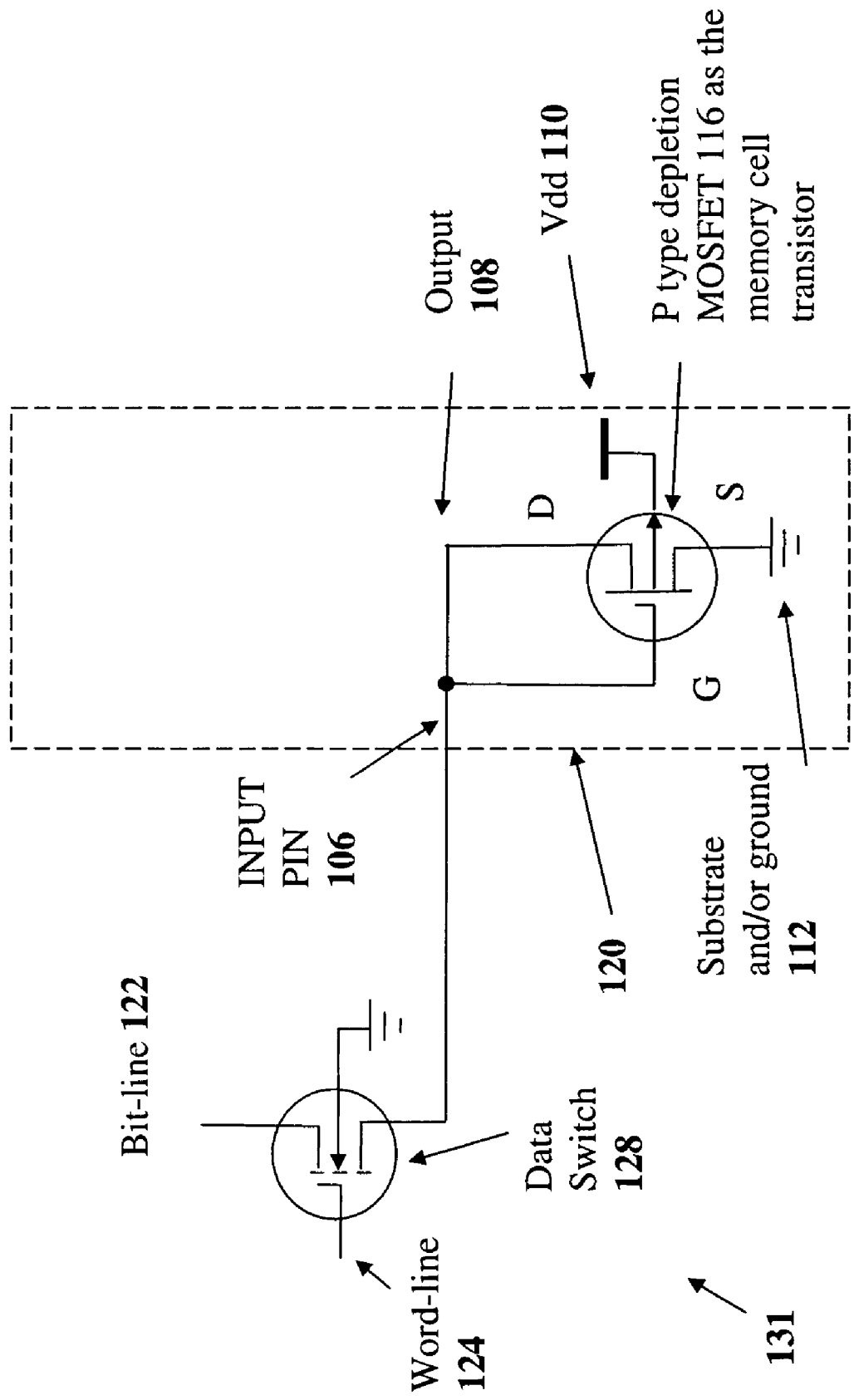
FIG. 29, the schematic diagram of a 2T-SRAM cell using a single P type depletion MOSFET as an alternate embodiment.

For the 2T-SRAM 131 as shown in FIG. 28, the memory cell transistor 114 will retain the logic high output state at the output pin 108 indefinitely as long as the power supply line is active while the logic low output state is retained by the stray capacitance at the output pin 108. As explained earlier, the pinch-off current through the drain-to-source channel of the memory cell transistor 114 and the leakage current from the logic high input state at bit-line 122 through the data switch transistor 128 can charge up the voltage at the output pin 108; fortunately, as long as the leakage current from the drain of the memory cell transistor 114 to the bulk is larger than the sum of the pinch-off current through the memory cell transistor 114 and the leakage current from the logic high input state at bit-line 122 through the data switch transistor 128, the logic low output state can still be retained by the stray capacitance at the output pin 108. Likewise, for the 2T-SRAM 131 as shown in FIG. 29, the memory cell transistor 116 will retain the logic low output state at output pin 108 indefinitely while the logic high output state is retained by the stray capacitance at the output pin 108. As explained earlier, the pinch-off current through the drain-to-source channel of the memory cell transistor 116 and the leakage current to the logic low input state at bit-line 122 through the data switch transistor 128 can discharge the voltage at the output pin 108; fortunately, as long as the leakage current from the bulk to the drain of the memory cell transistor 116 is larger than the sum of the pinch-off current through the memory cell transistor 116 and the leakage current to the logic low input state at bit-line 122 through the data switch transistor 128, the logic high output state can still be retained by the stray capacitance at the output pin 108 indefinitely as long as the power supply is active.

The 2T-SRAM memory cells 131 as shown in FIG. 28 and 29 are thus the simplest possible static memory cell. Since these two designs of 2T-SRAM memory cell 131 depend upon the leakage current which is very difficult to control precisely to retain one of the two output states, the yield of the 2T-SRAM memory cell 131 might be lower than the yield of 3T-SRAM 126. The leakage current, unfortunately, will also increase the power consumption of the 2T-SRAM memory cells 131. Since the 2T-SRAM memory cell 131 can be built without a well and with less hardware, the 2T-SRAM memory cell 131 can be built with a much higher density than 3T-SRAM memory cell 126. The advantage of higher density from 2T-SRAM memory cell 131 might weigh more than its lower yield and higher power consumption.

In the traditional DRAM cell, the leakage current to the substrate prevents the memory cell from retaining the logic high output state for a long period of time and it is very critical to reduce the amount of leakage current to the substrate. The leakage current to the substrate is a culprit to the defect of DRAM memory cell. In contrast, for a 2T-SRAM cell 131, the leakage current to or from the substrate will retain one of the two output states of memory cell and should be controlled to be within a certain level if possible. The leakage current to or from the substrate becomes a friendly helper. In the design of 3T-SRAM cell 126, the leakage current to or from the substrate is irrelevant since the output state will be retained only by the memory cell transistors. The new design of SRAM cells thus completely solves the leakage current problem of the DRAM cell.

In one embodiment of the 2T-SRAM, there is a depletion MOSFET transistor having a gate terminal coupled to a drain terminal, the substrate terminal coupled to a ground terminal or a positive voltage terminal and a source terminal coupled to a positive supply voltage terminal, or a ground terminal if the substrate terminal is coupled to the positive supply voltage. There is also an N type enhancement MOSFET transistor having one of a drain/source terminal coupled to the gate terminal of the depletion MOSFET transistor, a substrate terminal coupled to the ground terminal, the other of the drain/source terminal coupled to a data line and a gate terminal coupled to an address line, thereby forming a two-transistor static, random access memory (2T-SRAM).

In one embodiment of the 2T-SRAM, the depletion MOSFET transistor may be an N type transistor having the substrate terminal coupled to the ground terminal and the source terminal coupled to the positive supply voltage terminal, thereby forming a two-transistor static random access memory cell.

In an alternate embodiment of the 2T-SRAM, the depletion MOSFET transistor may be a P type transistor having the substrate terminal coupled to the positive supply voltage terminal and the source terminal coupled to the ground terminal thereby forming a two-transistor static random access memory cell.

In order to verify the operation of the 2T SRAM memory cell circuit, the following SPICE simulation, using the Philips MOSFET model 11020, was performed. This simulation shows that the 2T-SRAM cell should retain the unlatched output indefinitely. The Philips MOSFET model 11020 uses potential to describe the transistor so that the only difference between enhancement and depletion device is the voltage at the gate (VBF in the SPICE model file).

The boundary of the depletion mode of a depletion device is for VGS to be within 0 to −Vdd for the N type depletion MOSFET as shown in the FIG. 1.

Since the SPICE program always assigns the source pin to the lower voltage node for an N type MOSFET and this assignment is incorrect for the depletion device operated in the depletion mode because the depletion type MOSFET will never be pinched-off, it is impossible to test the normal operation of 2T-SRAM circuit by using the current SPICE program as is. Nevertheless, the simulation of the operation of 2T-SRAM can still be done separately for the latched mode and unlatched mode as shown in the procedure below. Before the simulation of 2T-SRAM begins; at first, we need to make sure that the transistor model is correct.

Figure 32:
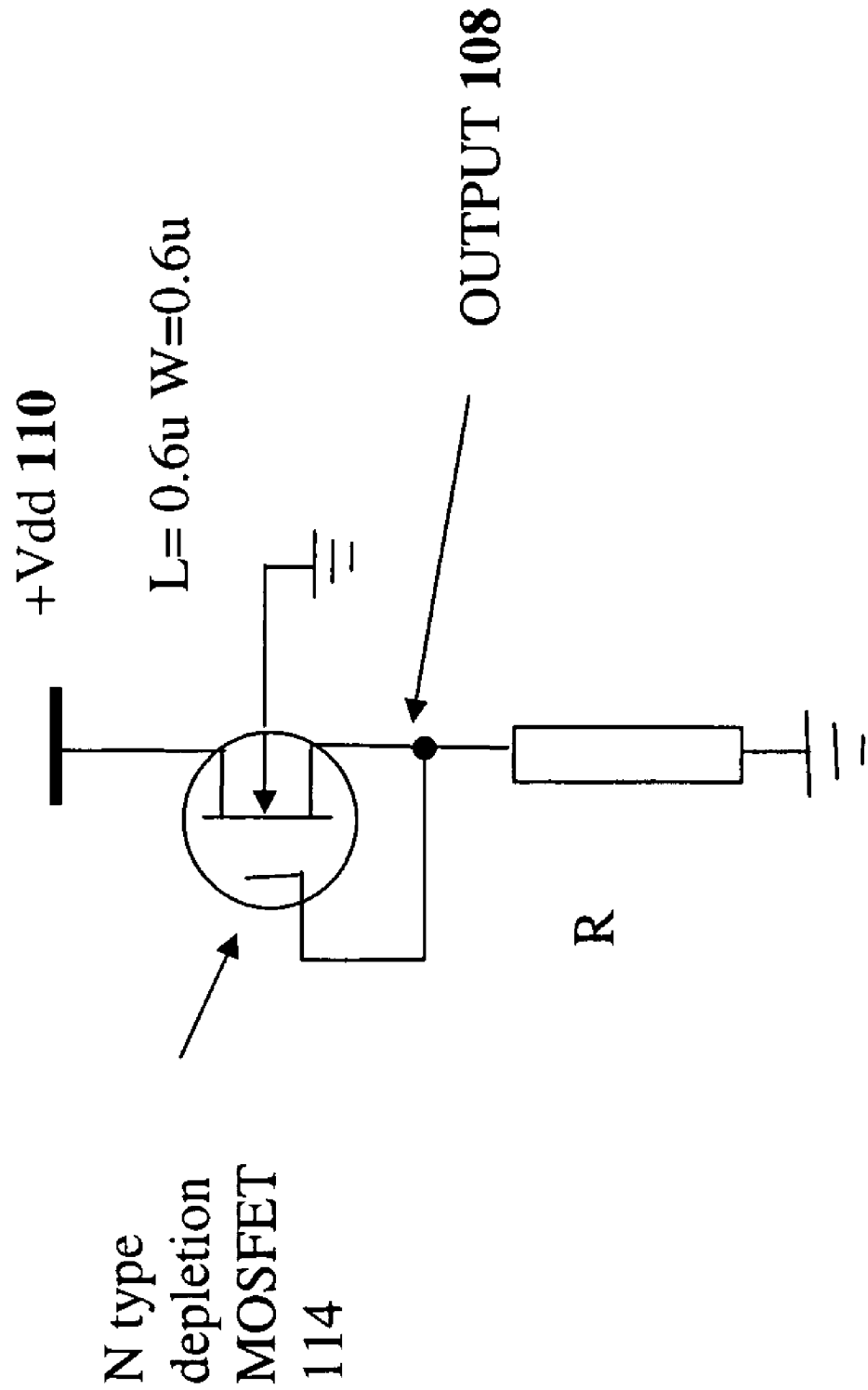
FIG. 32, the schematic diagram for the test circuit #1 to verify the SPICE model.

A test circuit #1 as shown in the FIG. 32 is used to verify the latched mode of N depletion MOSFET's operation. In the latched mode, the Vdd 110 is set to 2.2V and the resistor R is set to 10 Kohm and the VBF value of the transistor is −2.5V and the voltage across the resistor indicates the amount of IDSS 103 since the voltage across the gate and source is zero volt to the SPICE program. The output voltage is found to be 719 mV so that IDSS is found to be equal to 71.9 uA. There is a small oscillation at the output voltage with peak-to-peak fluctuation of 40 uV. This small oscillation is probably due to the positive feedback or converging of the SPICE program. Since the spurious oscillation is so small, although undesirable, the oscillation is not harmful to the output state. This test #1 thus verifies the first operating point of the depletion mode for the N type depletion MOSFET at VGS=0.

Figure 33:
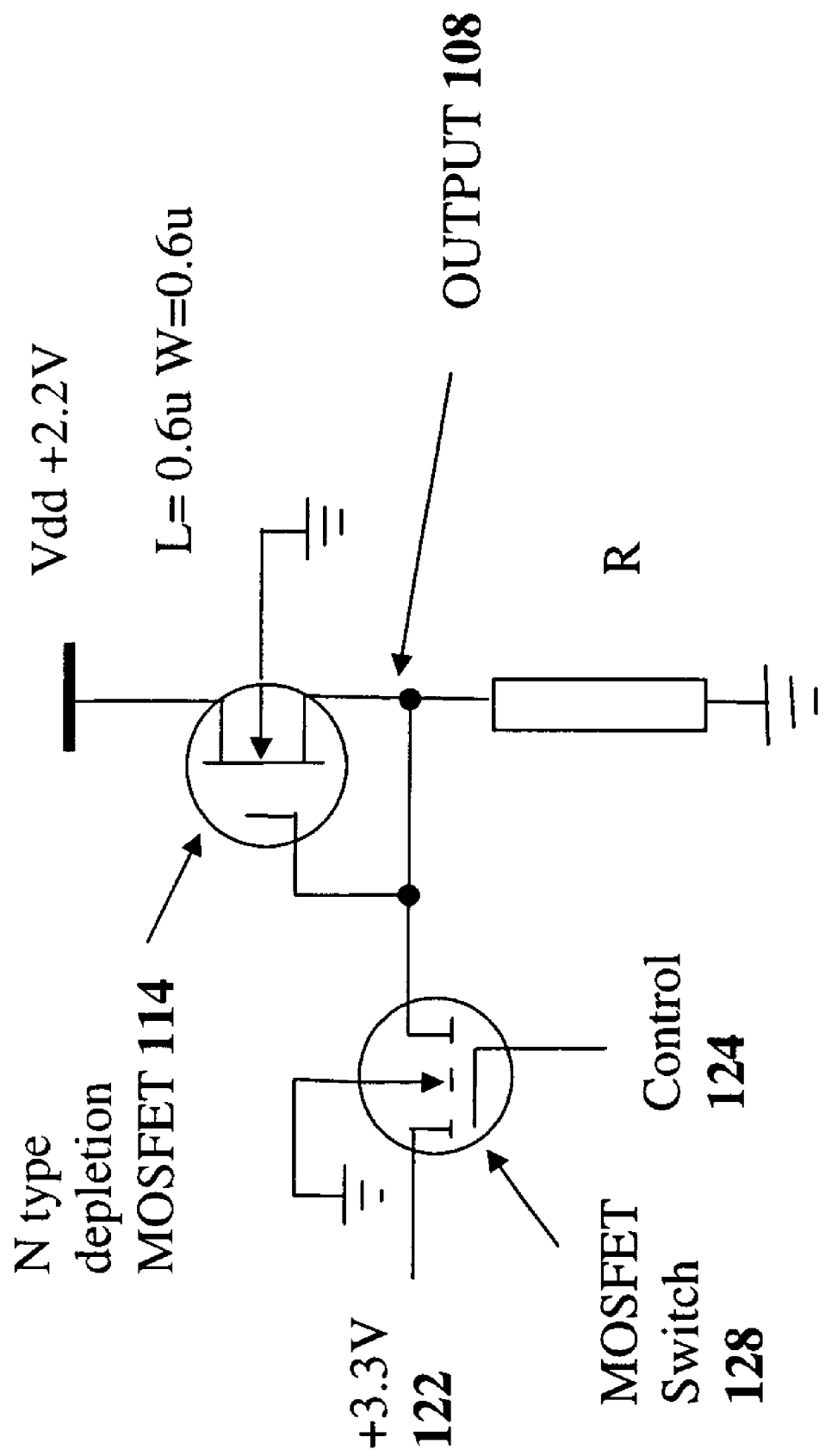
FIG. 33, the schematic diagram for the test circuit #2 to prove the unlatched state of 2T-SRAM.

To verify the second operating point of the depletion mode at pinch-off, the resistance of the load resistor is changed to $10^{11}$ ohm and the VBF is changed to −0.5V. The setting of VBF=−0.5V pinches off the channel even at VGS=0 V. The operating point of the transistor now is at pinch-off with very little current flowing through the resistor so that a high value resistance is needed to read the current. The voltage at the output is found to be equal to 200 mV so that the current through the resistor is 2 pA and indeed, the transistor is pinched-off. After verifying the operation of the transistor at both pinch-off and zero bias points, the switch transistor 128 is then added and the test circuit #2 as shown in FIG. 33 can test the unlatched operation of the 2T-SRAM.

A +3.3V is used as the bit-line input 122 to produce the maximum leakage current through the switch transistor 128. A digital signal with peak logic high of 3.3V is used as the word-line signal 124 to enable the switch 128. The switch 128 is enabled for only a short period at the beginning of the simulation to show the operation of the switch 128. After that, the switch 128 is disabled for the rest of the testing while the output voltage 108 is monitored. The output voltage 108 is found to be equal to 423.08 mV and the adding of switching transistor 128 more than doubles the output voltage 108. When the voltage of the bit-line input 122 is switched to 0V the output voltage 108 drops to 183 mV. Apparently, the impedance of the switch transistor 128 does affect the output voltage 108 of the memory cell 120. Both transistors of the test circuit #2 are made with minimum size. The size of the transistor was found not a factor to determine the output voltage 108.

The output voltage 108 of the unlatched mode of the 2T-SRAM memory cell is basically equal to the sum of the voltage inputs from the bit-line input 122 and the power supply Vdd 110 of the memory cell. During the unlatched mode, both the memory cell 114 and the switch 128 are at high impedance state and become high impedance resistors. Each of the two voltage sources are divided down by the transistors and added up to become the output voltage 108. For the memory cell transistor 114, the voltage source is Vdd 110 and the resistor divider is made of the pinch-off current through D-S channel of the depletion MOSFET 114 and the leakage current from the Drain to the substrate; for the switch transistor 128, the voltage source is the voltage at bit-line input 122 and the resistor divider is also made of the leakage current through the D-S channel of the switch transistor 128 and the leakage current from the Drain to the substrate. Since the ratio of these two currents is determined by the transistor and is constant when the ambient temperature is fixed, the output voltage will remain constant and stable and will not run away. Even if the temperature rises, since the leakage current will become larger when the temperature rise, the larger leakage current will ensure that the output voltage remain stable. Nevertheless, the output voltage can vary over a large range due to the spread of leakage current. A larger leakage current is actually very desirable to stabilize the output voltage 118 since it will produce less output voltage during the unlatched mode. This is a drastic departure from all the current DRAM technologies. The same leakage current that caused problem for the DRAM is now needed to maintain a stable desired output state.

MIXED LOGIC GATES

Figure 30:
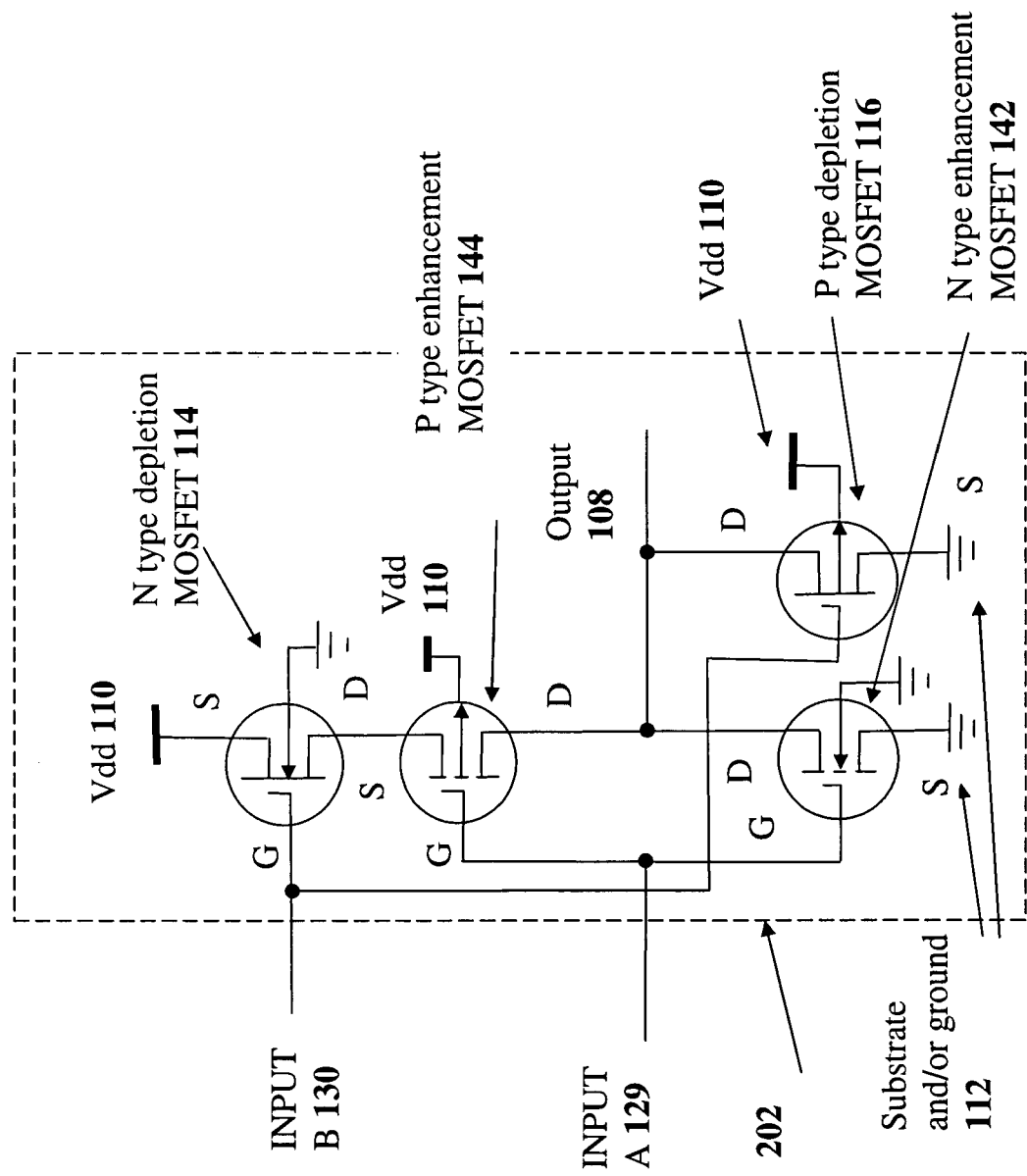
FIG. 30, the schematic diagram of a mixed AND logic gate (/A)B using both enhancement and depletion MOSFETs.

It is also possible to mix the enhancement type and depletion type MOSFET together to form mixed AND and OR gate. The advantage of using both types of MOSFET to produce simple logic gate is that both the negative logic and positive logic output can be produced at the same time without the need for additional inverter. For example, a mixed AND gate 202 to produce the logic of (/A)B can be shown as in FIG. 30 by replacing the depletion type MOSFET with enhancement type MOSFET for one of the input signals in the original AND logic circuit 132 as shown in FIG. 10. In this design of mixed AND gate 202, the A input 129 is connected to the gates of both the N type and P type enhancement MOSFETs and the B input 130 is connected to the gates of both N type and P type depletion MOSFETs. Since the enhancement device and depletion device are opposite in the logic output, the N type depletion MOSFET 114 must be connected in series with the P type enhancement MOSFET 144 and the P type depletion MOSFET 116 must be connected in parallel with the N type enhancement MOSFET 142 to produce an AND logic. As a result, a mixed AND is produced from inverted A and normal B so that the output 108 becomes logic low when either the B input 130 is at logic low and the P depletion type MOSFET 116 is not energized or when the A input 129 is at logic high and the N enhancement type MOSFET 142 is energized. The output 108 can only become logic high when both the B input 130 is at logic high and the N type depletion MOSFET 114 is not energized and when A input 129 is at logic low and the P type enhancement MOSFET 144 is energized.

Figure 31:
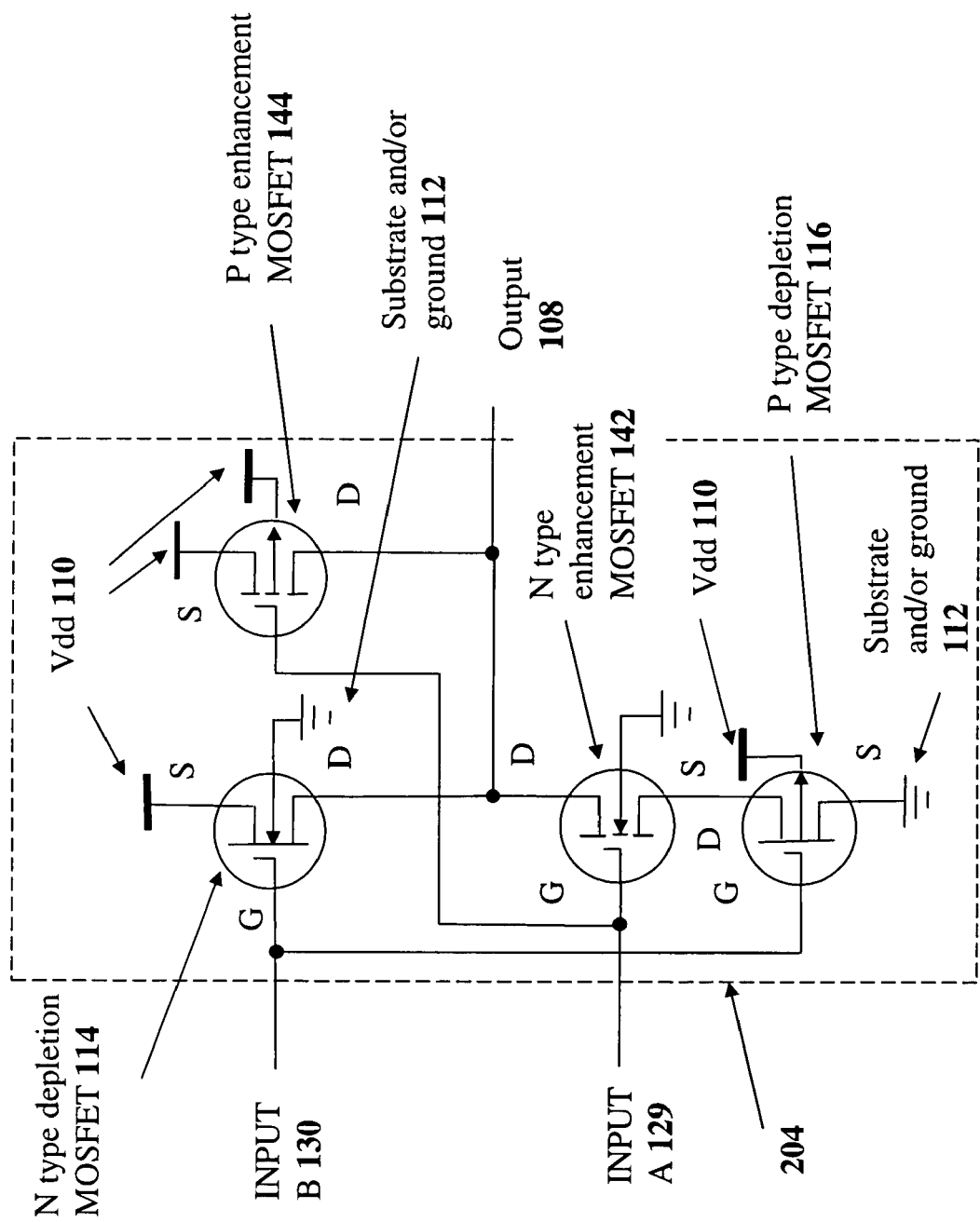
FIG. 31, the schematic diagram of a mixed OR logic gate (/A)+B using both enhancement and depletion MOSFETs.

In one embodiment of the mixed AND gate, there is an N type depletion MOSFET transistor, P type depletion MOSFET transistor, a N type enhancement MOSFET transistor and a P type enhancement MOSFET transistor. A first input terminal is coupled to a gate terminal of the P type enhancement MOSFET transistor and to a gate terminal of the N type enhancement MOSFET transistor. A second input terminal is coupled to a gate terminal of the N type depletion MOSFET transistor and to a gate terminal of the P type depletion MOSFET transistor. A positive voltage supply terminal is coupled to a source terminal of the N type depletion MOSFET transistor and to a substrate terminal of both the P type enhancement MOSFET transistor and the P type depletion MOSFET transistor. A ground terminal is coupled to a source terminal of both the P type depletion MOSFET transistor and the N type enhancement MOSFET transistor, and to a substrate terminal of the N type enhancement MOSFET transistor. An output terminal is coupled to a drain terminal of the N type depletion MOSFET transistor, the P type enhancement MOSFET transistor and the N type enhancement MOSFET transistor, thereby creating an mixed AND Boolean logic circuit Likewise, a mixed OR gate 204 to produce the logic of (/A)+B can be shown as in FIG. 31 by replacing the depletion type MOSFET with enhancement type MOSFET for one of the input signals in the original OR logic circuit 134 as shown in FIG. 11. In this design of mixed OR gate 204, the A input 129 is connected to the gates of both the N type and P type enhancement MOSFETs and the B input 130 is connected to the gates of both N type and P type depletion MOSFETs. Since the enhancement device and depletion device are opposite in the logic output, the N type depletion MOSFET 114 must be connected in parallel with the P type enhancement MOSFET 144 and the P type depletion MOSFET 116 must be connected in series with the N type enhancement MOSFET 142 to produce an OR logic. As a result, a mixed OR logic is produced from inverted A or normal B so that the output 108 becomes logic high when either the B input 130 is at logic high and the N depletion type MOSFET 114 is not energized or when the A input 129 is at logic low and the P enhancement type MOSFET 144 is energized. The output 108 can only become logic low when both the B input 130 is at logic low and the P type depletion MOSFET 116 is not energized and when A input 129 is at logic high and the N type enhancement MOSFET 142 is energized.

Although the invention has been described in language specific to structural features and/or methodological acts, it is to be understood that the invention defined in the appended claims is not necessarily limited to the specific features or acts described. Rather, the specific features and acts are disclosed as exemplary forms of implementing the claimed invention. Modifications may readily be devised by those ordinarily skilled in the art without departing from the spirit or scope of the present invention.

What is claimed is:

1. A static, random access memory device, comprising:
  a memory cell comprising at least one depletion MOSFET transistor having a gate terminal coupled to a drain terminal, a substrate terminal coupled to a ground terminal/a positive voltage terminal and a source terminal coupled to a positive supply voltage terminal/a ground terminal; and an N type enhancement MOSFET transistor having a drain terminal coupled to said gate terminal of said at least one depletion MOSFET transistor, a substrate terminal coupled to said ground terminal, a source terminal coupled to a data line and a gate terminal coupled to an address line, thereby forming a two-transistor static, random access memory, wherein said depletion MOSFET transistor is an N type transistor having said substrate terminal coupled to said ground terminal and said source terminal coupled to said positive supply voltage terminal, thereby forming a two transistor static random access memory cell (2T(NN)-SRAM).

2. A static, random access memory device, comprising:

a memory cell comprising at least one depletion MOSFET transistor having a gate terminal coupled to a drain terminal, a substrate terminal coupled to a ground terminal/a positive voltage terminal and a source terminal coupled to a positive supply voltage terminal/a ground terminal; and an N type enhancement MOSFET transistor having a drain terminal coupled to said gate terminal of said at least one depletion MOSFET transistor, a substrate terminal coupled to said ground terminal, a source terminal coupled to a data line and a gate terminal coupled to an address line, thereby forming a two-transistor static, random access memory, wherein said depletion MOSFET transistor is a P type transistor having said substrate terminal coupled to said positive supply voltage terminal and said source terminal coupled to said ground terminal thereby forming a two-transistor static random access memory cell (2T(NP)-SRAM).

3. A static, random access memory device, comprising:

a memory cell comprising at least one depletion MOSFET transistor, a fixed potential terminal biased at the logic level opposite to logic level of substrate terminal, wherein said at least one depletion MOSFET transistor is an N type transistor having a gate terminal coupled to an input terminal, a drain terminal coupled to an output terminal, a substrate terminal coupled to a ground terminal and a source terminal coupled to a positive voltage supply terminal; and further comprising a resistor having a first terminal coupled to said drain terminal of said N type depletion MOSFET transistor, and a second terminal coupled to said ground terminal, thereby forming a one-transistor, one-resistor, non-inverting buffer (1T(N)1R).

4. The device of claim 3 wherein said gate terminal of said N type depletion MOSFET transistor is coupled to said drain terminal of said N type depletion MOSFET transistor; and further comprising an N type enhancement MOSFET transistor having a drain terminal coupled to said gate terminal of said N type depletion MOSFET transistor, a substrate terminal coupled to said ground terminal, a source terminal coupled to a data line and a gate terminal coupled to an address line, thereby forming a two-transistor, 1 resistor, static random access memory (2T(NN)1R-SRAM).

5. A static, random access memory device, comprising:

a memory cell comprising at least one depletion MOSFET transistor, a fixed potential terminal biased at the logic level opposite to logic level of substrate terminal, wherein said at least one depletion MOSFET transistor is a P type transistor having a gate terminal coupled to an input terminal, a substrate terminal coupled to a positive voltage supply terminal and a source terminal coupled to a ground terminal; and further comprising a resistor having a first terminal coupled to said drain terminal of said P type depletion MOSFET transistor, and a second terminal coupled to said positive voltage supply terminal, thereby forming a one-transistor, one resistor non-inverting buffer.

6. The device of claim 5 wherein said gate terminal of said P type depletion MOSFET transistor is coupled to said drain terminal of said P type depletion MOSFET transistor; and further comprising an N type enhancement MOSFET transistor having one of a drain/source terminal coupled to said gate terminal of said P type depletion MOSFET transistor, a substrate terminal coupled to said ground terminal, the other of the drain/source terminal coupled to a data line and a gate terminal coupled to an address line, thereby forming a two-transistor, one resistor static random access memory (2T(NP)1R-SRAM).

7. A static, random access memory device, comprising:

a memory cell comprising at least one depletion MOSFET transistor, a fixed potential terminal biased at the logic level opposite to logic level of substrate terminal, comprising an N type depletion MOSFET transistor and a P type depletion MOSFET transistor, and wherein said N type depletion MOSFET transistor has a source terminal coupled to a positive voltage supply terminal, a substrate terminal coupled to a ground terminal, a gate terminal coupled to an input terminal, and a drain terminal coupled to an output terminal; said P type depletion MOSFET transistor has a source terminal couple to said ground terminal, a substrate terminal coupled to said positive voltage supply terminal, a gate terminal coupled to said input terminal and a drain terminal coupled to an output terminal, thereby forming a two transistor, non-inverting buffer.

8. The device of claim 7 wherein said gate terminal of said N type depletion MOSFET transistor is coupled to said drain terminal of said N type depletion MOSFET transistor, to said gate terminal of said P type depletion MOSFET transistor and to said drain terminal of said P type depletion MOSFET transistor; and further comprising an N type enhancement MOSFET transistor having a drain terminal coupled to said gate terminal of said N type depletion MOSFET transistor, a substrate terminal coupled to said ground terminal, a source terminal coupled to a data line and a gate terminal coupled to an address line, thereby forming a three-transistor static random access memory (3T-SRAM).

* * * * *